(12) United States Patent
Nii

(10) Patent No.: US 7,286,391 B2
(45) Date of Patent: Oct. 23, 2007

(54) SEMICONDUCTOR MEMORY DEVICE CAPABLE OF CONTROLLING POTENTIAL LEVEL OF POWER SUPPLY LINE AND/OR GROUND LINE

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/086,345

(22) Filed: Mar. 23, 2005

(65) Prior Publication Data
US 2005/0162919 A1 Jul. 28, 2005

Related U.S. Application Data

(62) Division of application No. 10/689,344, filed on Oct. 21, 2003, now Pat. No. 6,903,962.

(30) Foreign Application Priority Data
Jun. 5, 2003 (JP) .............................. 2003-161115

(51) Int. Cl.
*G11C 11/00* (2006.01)
*G11C 5/14* (2006.01)
(52) U.S. Cl. .................. 365/156; 365/154; 365/189.09
(58) Field of Classification Search ................. 365/156
See application file for complete search history.

(56) References Cited

U.S. PATENT DOCUMENTS 4,764,897 A * 8/1988 Kameyama et al. ........ 365/154
5,581,500 A * 12/1996 D'Souza ..................... 365/156
5,621,693 A * 4/1997 Nakase ....................... 365/227
5,680,356 A * 10/1997 Yamauchi ................... 365/205
5,687,178 A 11/1997 Herr et al.
5,726,562 A 3/1998 Mizuno
5,757,702 A 5/1998 Iwata et al.
5,764,566 A 6/1998 Akamatsu et al.
5,986,923 A * 11/1999 Zhang et al. ............... 365/154
6,011,713 A * 1/2000 Yamane et al. ............. 365/156

(Continued)

FOREIGN PATENT DOCUMENTS

JP 8-161890 6/1996

(Continued)

OTHER PUBLICATIONS

"Dynamically Controllable DC Level Converter (DCLC) Technique to Reduce Power Dissipation, and Application to High-Speed, Low-Power Circuits", Yoshinori Oka et al., Technical Report of IEICE, SDM2001-122, ICD2001-45, Aug. 2001, pp. 69-76.

Primary Examiner—Son L. Mai
(74) Attorney, Agent, or Firm—McDermott Will & Emery LLP

(57) ABSTRACT

Level control signals are both set to H level, and potentials of power supply lines are both set to be lower than a power supply potential. In this manner, a gate leakage current during waiting and writing operation of a memory cell array can significantly be reduced. The level control signals are set to L level and H level respectively, and solely the potential of one of the power supply lines is set to be lower than the power supply potential. In this manner, power consumption during a reading operation of the memory cell array can be reduced.

6 Claims, 28 Drawing Sheets

U.S. PATENT DOCUMENTS

| | | | |
|---|---|---|---|
| 6,172,901 B1 * | 1/2001 | Portacci | 365/154 |
| 6,560,139 B2 * | 5/2003 | Ma et al. | 365/154 |
| 6,657,911 B2 | 12/2003 | Yamaoka et al. | |
| 6,826,074 B2 | 11/2004 | Yamauchi | |
| 2004/0090820 A1 * | 5/2004 | Pathak et al. | 365/154 |

FOREIGN PATENT DOCUMENTS

| | | |
|---|---|---|
| JP | 9-73784 | 3/1997 |
| JP | P2002-288984 A | 10/2002 |

* cited by examiner

FIG.30

| OPERATION MODE | RT | DCL2 | DCL1 | DCL0 | CS | KILL | VM |
|---|---|---|---|---|---|---|---|
| DURING ACCESS | X | X | X | X | H | H | VDD |
| DURING NON-ACCESS | H | L | H | H | L | X | VDD−2Vtp |
| | H | H | L | H | L | X | VDD−Vtp |
| | H | H | H | L | L | X | VDD |
| DURING REDUNDANCY REPLACEMENT | H | H | H | H | X | L | Hi-Z |
| DURING RETENTION TEST | L | H | H | H | L | X | VDD |

FIG.33

| OPERATION MODE | /RT | /DCL2 | /DCL1 | /DCL0 | /CS | /KILL | GG |
|---|---|---|---|---|---|---|---|
| DURING ACCESS | X | X | X | X | L | L | GND |
| DURING NON-ACCESS | L | H | L | L | H | X | GND+2Vtn |
|  | L | L | H | L | H | X | GND+Vtn |
|  | L | L | L | H | H | X | GND |
| DURING REDUNDANCY REPLACEMENT | L | L | L | L | X | H | Hi-Z |
| DURING RETENTION TEST | H | L | L | L | H | X | GND |

SEMICONDUCTOR MEMORY DEVICE CAPABLE OF CONTROLLING POTENTIAL LEVEL OF POWER SUPPLY LINE AND/OR GROUND LINE

RELATED APPLICATIONS

This application is a divisional of U.S. patent application Ser. No. 10/689,344, filed Oct. 21, 2003, U.S. Pat. No. 6,903,962, which is based on Japanese Patent Application No. 2003-161115(P), filed Jun. 5, 2003 and the contents of which are hereby incorporated by reference.

BACKGROUND OF THE INVENTION

1. Field of the Invention

The present invention relates to a semiconductor memory device, and more particularly to a semiconductor memory device capable of holding storage data without a refresh operation.

2. Description of the Background Art

In a semiconductor memory device, in particular in an SRAM (Static Random Access Memory), power consumption can be lowered by controlling a source potential of a transistor constituting a memory cell so as to suppress a leakage current that flows between the source and the drain, for example.

A conventional semiconductor memory device (a semiconductor device) disclosed in Japanese Patent Laying-Open No. 9-73784 reduces the leakage current by maintaining a reading speed by setting the source potential equal to a substrate potential during an operation, and by setting an absolute potential of the source to be higher than the substrate potential during waiting. Though the conventional semiconductor memory device disclosed in Japanese Patent Laying-Open No. 9-73784 effectively reduces the leakage current during waiting, it does not reduce the leakage current during the operation. Therefore, lowering of power consumption during the operation is not expected.

Generally, power consumed during operation of the semiconductor memory device is the sum of power consumption by charging/discharging current of a bit line or the like and power consumption by the leakage current. Though the charging/discharging current of the bit line or the like has accounted for a large part of the power consumption so far, power consumption by the leakage current during operation is not negligible when the threshold value is set lower in accordance with the higher speed of the semiconductor memory device.

A conventional semiconductor memory device (a semiconductor integrated circuit) disclosed in Japanese Patent Laying-Open No. 2002-288984 reduces the leakage current by setting the source potential of a selected memory cell row to be equal to the substrate potential and by setting the absolute potential of the source of a non-selected memory cell row to be higher than the substrate potential during a reading operation. The conventional semiconductor memory device disclosed in Japanese Patent Laying-Open No. 2002-288984 can suppress the leakage current in memory cells other than the selected memory cell even during the operation. For example, in the case of a semiconductor memory device including a memory cell array of 512 rows and 512 columns, 512 memory cells, that are equivalent to one row, are selected, and hence an increase of the overall leakage current is suppressed to 1/512.

As described above, the conventional semiconductor memory devices disclosed in the references above have lowered power consumption by controlling the source potential so as to suppress the leakage current that flows between the source and the drain. On the other hand, these semiconductor memory devices cannot reduce power consumption by the charging/discharging current of the bit line or the like, which is one factor of the power consumption during operation.

In addition, with regard to the conventional semiconductor memory devices disclosed in the references above, only an example of a single-port memory cell constituted of 6 transistors has been shown, and lower power consumption in an example of a multi-port memory cell including a bit line dedicated for reading has not been shown.

Moreover, with regard to the conventional semiconductor memory devices disclosed in the references above, the leakage current between the source and the drain in a transistor that has turned off is solely considered. Namely, an influence of the gate leakage current, which has become apparent as a gate insulating film is made thinner, has not been addressed.

SUMMARY OF THE INVENTION

An object of the present invention is to provide a semiconductor memory device capable of reducing power consumption caused by a charging/discharging current of a bit line or the like as well as caused by a gate leakage current of a memory cell in a non-selected column.

A semiconductor memory device according to one aspect of the present invention includes a plurality of memory cells arranged in matrix of rows and columns, and a plurality of write word lines arranged individually for each of the plurality of memory cells. Each of the plurality of memory cells includes a data storage portion holding data, a data write portion writing data into the data storage portion, and a data read portion having a read bit line for reading data from the data storage portion. The data storage portion has first and second inverter circuits connected in common to a power supply line arranged corresponding to respective columns of the plurality of memory cells. The semiconductor memory device further includes a power supply line level control circuit controlling a potential level of the power supply line to a power supply potential or to a prescribed potential level lower than the power supply potential in response to a level control signal set for each column.

A semiconductor memory device according to another aspect of the present invention includes a plurality of memory cells arranged in matrix of rows and columns, and a plurality of write word lines arranged individually for each of the plurality of memory cells. Each of the plurality of memory cells includes a data storage portion holding data, a data write portion writing data into the data storage portion, and a data read portion having a read bit line for reading data from the data storage portion. The data storage portion has a first inverter circuit connected to a first power supply line arranged corresponding to respective columns of the plurality of memory cells, and a second inverter circuit connected to a second power supply line arranged corresponding to respective columns of the plurality of memory cells. The semiconductor memory device further includes a power supply line level control circuit controlling a potential level of the second power supply line to a power supply potential or to a prescribed potential level lower than the power supply potential for each column in response to a level control signal set for each column.

A semiconductor memory device according to yet another aspect of the present invention includes a plurality of memory cells arranged in matrix of rows and columns, and a plurality of write word lines arranged individually for each of the plurality of memory cells. Each of the plurality of memory cells includes a data storage portion holding data, a data write portion writing data into the data storage portion, and a data read portion having a read bit line for reading data from the data storage portion. The data storage portion has a first inverter circuit operating at a power supply potential or a prescribed potential level lower than the power supply potential in response to a level control signal set for each column, and a second inverter circuit operating at the prescribed potential level.

A semiconductor memory device according to yet another aspect of the present invention includes a plurality of memory cells arranged in matrix of rows and columns, and a plurality of write word lines arranged individually for each of the plurality of memory cells. Each of the plurality of memory cells includes a data storage portion holding data, a data write portion writing data into the data storage portion, and a data read portion having a read bit line for reading data from the data storage portion. The data storage portion has a first inverter circuit operating at a power supply potential or a prescribed potential level lower than the power supply potential in response to a level control signal set for each column and a second level control signal set for each row, and a second inverter circuit operating at the prescribed potential level.

A semiconductor memory device according to yet another aspect of the present invention includes a plurality of memory cells arranged in matrix of rows and columns, and a plurality of write word lines arranged individually for each of the plurality of memory cells. Each of the plurality of memory cells includes a data storage portion holding data, a data write portion writing data into the data storage portion, and a data read portion having a read bit line for reading data from the data storage portion. The data storage portion has first and second inverter circuits connected in common to a ground line arranged corresponding to respective columns of the plurality of memory cells. The semiconductor memory device further includes a ground line level control circuit controlling a potential level of the ground line to a ground potential or to a prescribed potential level higher than the ground potential in response to a level control signal set for each column.

A semiconductor memory device according to yet another aspect of the present invention includes a plurality of memory cells arranged in matrix of rows and columns, a plurality of word lines arranged for each row of the plurality of memory cells, and a plurality of bit line pairs arranged for each column of the plurality of memory cells. Each of the plurality of memory cells includes a data storage portion holding data, and a data write/read portion performing write/read of data to/from the data storage portion. The data storage portion has first and second inverter circuits connected in common to a power supply line arranged corresponding to respective columns of the plurality of memory cells. The semiconductor memory device further includes a power supply line level control circuit controlling a potential level of the power supply line to a power supply potential or to a prescribed potential level lower than the power supply potential for each column in response to a level control signal set for each column.

A semiconductor memory device according to yet another aspect of the present invention includes a plurality of memory cells arranged in matrix of rows and columns, a plurality of word lines arranged for each row of the plurality of memory cells, and a plurality of bit line pairs arranged for each column of the plurality of memory cells. Each of the plurality of memory cells includes a data storage portion holding data, and a data write/read portion performing write/read of data to/from the data storage portion. The data storage portion has first and second inverter circuits connected in common to a ground line arranged corresponding to respective columns of the plurality of memory cells. The semiconductor memory device further includes a ground line level control circuit controlling a potential level of the ground line to a ground potential or to a prescribed potential level higher than the ground potential for each column in response to a level control signal set for each column.

Therefore, according to the present invention, power consumption by a charging/discharging current of a bit line or the like as well as by a gate leakage current of a memory cell in a non-selected column can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 30 illustrates an operation of power supply line level switching circuit 200 in Embodiment 8 of the present invention.

FIG. 33 illustrates an operation of ground line level switching circuit 300 in Embodiment 9 of the present invention.

DESCRIPTION OF THE PREFERRED EMBODIMENTS

Figure 1:
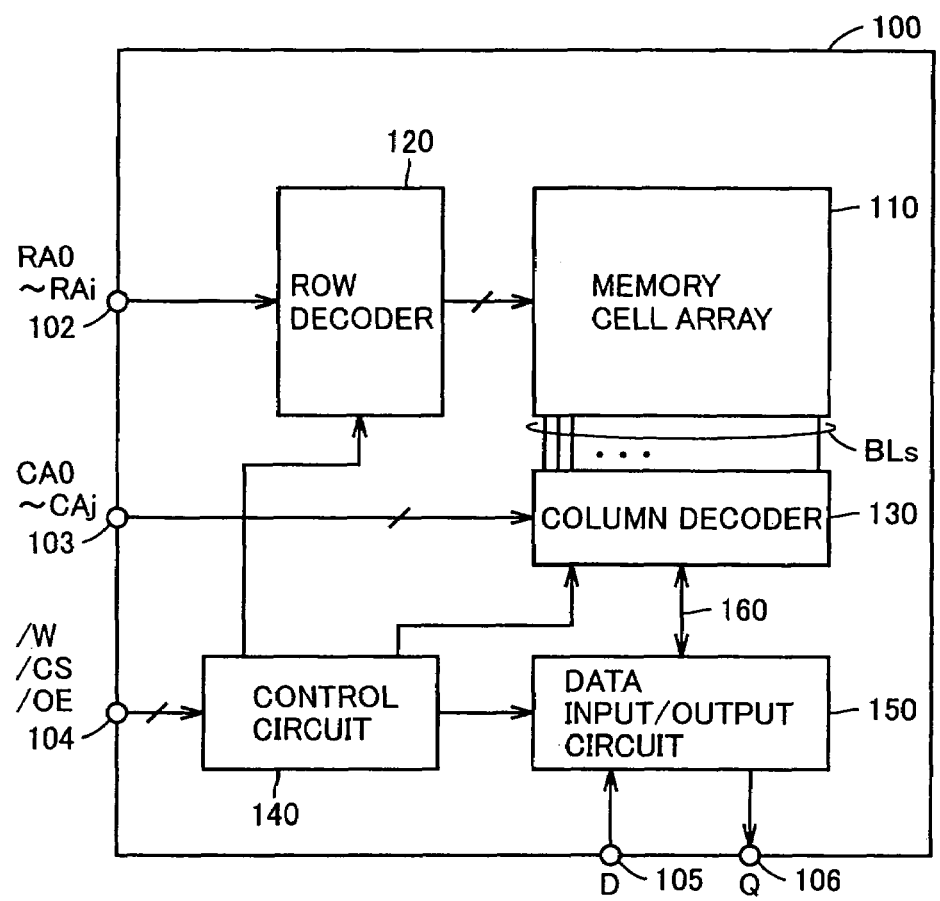
FIG. 1 is a schematic block diagram showing a general configuration of a semiconductor memory device 100 in embodiments of the present invention.

In the following, embodiments of the present invention will be described in detail with reference to the figures. It is noted that the same reference characters refer to the same or corresponding components in the figures, and description thereof will not be repeated.

FIG. 1 is a schematic block diagram showing a general configuration of a semiconductor memory device 100 in embodiments of the present invention.

Semiconductor memory device 100 is a static memory device (SRAM, for example) capable of holding storage data without a refresh operation.

Referring to FIG. 1, semiconductor memory device 100 includes a row address terminal 102 receiving row address signals RA0 to RAi (i: natural number), a column address terminal 103 receiving column address signals CA0 to CAj (j: natural number), a control signal terminal 104 receiving control signals such as a read/write control signal /W, a chip select signal /ICS, an output enable signal /OE, and the like, a data input terminal 105 receiving input data D, and a data output terminal 106 providing output data Q. Note that a symbol "/" preceding a signal represents inversion of that signal.

Semiconductor memory device 100 further includes a memory cell array 110 having a plurality of memory cells arranged in matrix of rows and columns, a row decoder 120 decoding row address signals RA0 to RAi and selecting a memory cell row, a column decoder 130 decoding column address signals CA0 to CAj and selecting a memory cell column, a control circuit 140 controlling an internal operation of semiconductor memory device 100 in response to a control signal, and a data input/output circuit 150 receiving/providing data between a data I/O line 160 and data input/output terminals 105, 106.

Column decoder 130 includes a column select circuit coupling one of bit lines BLs provided corresponding to memory cell columns respectively to data I/O line 160, or the like. Data input/output circuit 150 includes a write driver for writing input data D into memory cell array 110 via data I/O line 160, an amplifier circuit for amplifying read data transmitted to data I/O line 160, or the like. In the following, detailed description of memory cell array 110 and its peripheral circuit, or memory cell array 110 will be provided for each Embodiment 1 to 7.

Embodiment 1

Figure 2:
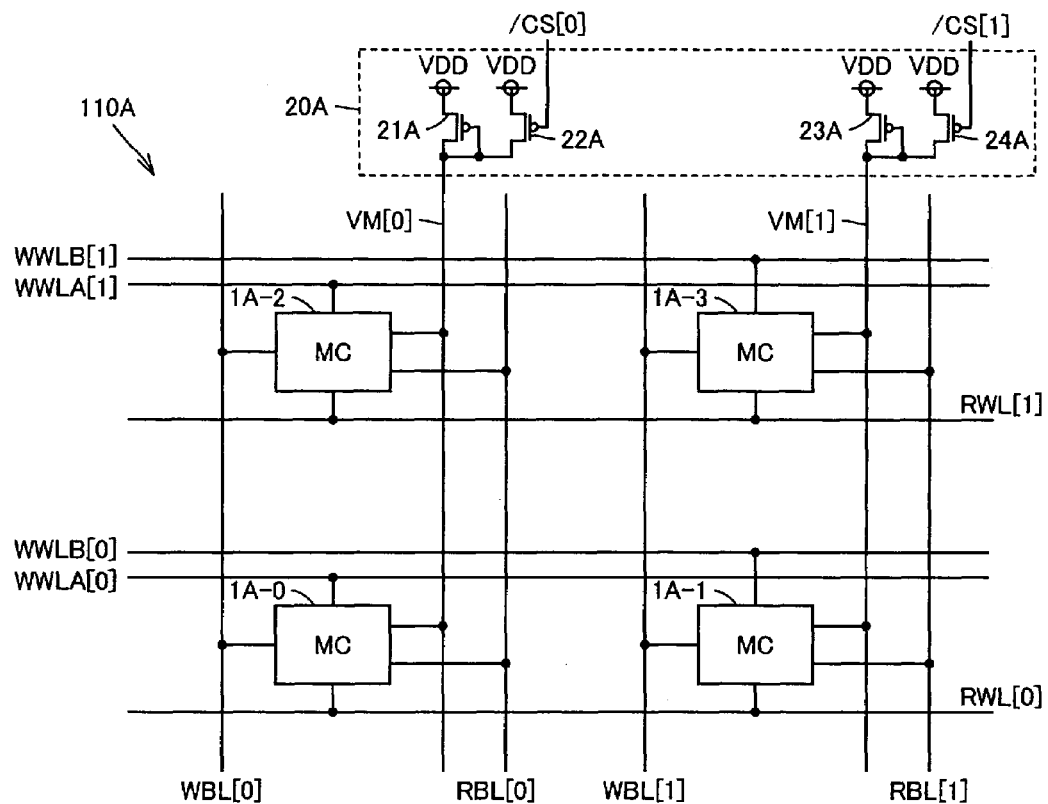
FIG. 2 is a circuit diagram showing a circuit configuration of a memory cell array 110A and its periphery in Embodiment 1 of the present invention.

FIG. 2 is a circuit diagram showing a circuit configuration of a memory cell array 110A and its periphery in Embodiment 1 of the present invention. Memory cell array 110A of Embodiment 1 shown in FIG. 2 has a memory cell array configuration of two rows and two columns, for example.

Referring to FIG. 2, memory cell array 110A in Embodiment 1 includes memory cells 1A-0, 1A-1, 1A-2, 1A-3 arranged in matrix of rows and columns, write word lines WWLA[0], WWLA[1], WWLB[0], WWLB[1] and read word lines RWL[0], RWL[1] arranged in a direction of row, and write bit lines WBL[0], WBL[1] and read bit lines RBL[0], RBL[1] arranged in a direction of column.

Write word lines WWLA[0], WWLB[0] are connected to memory cells 1A-0, 1A-1 respectively, whereas write word lines WWLA[1], WWLB[1] are connected to memory cells 1A-2, 1A-3 respectively. In this manner, in memory cell array 110A of Embodiment 1, a separate write word line is allocated to each memory cell, even if memory cells are located in the same row. Accordingly, data can be written into a memory cell in a specific column in a memory cell consisting of a plurality of columns.

Read word line RWL[0] is connected in common to memory cells 1A-0, 1A-1, while read word line RWL[1] is connected in common to memory cells 1A-2, 1A-3. Write bit line WBL[0] is connected in common to memory cells 1A-0, 1A-2, while write bit line WBL[1] is connected in common to memory cells 1A-1, 1A-3. Read bit line RBL[0] is connected in common to memory cells 1A-0, 1A-2, while read bit line RBL[1] is connected in common to memory cells 1A-1, 1A-3.

Memory cell array 110A in Embodiment 1 is connected to a power supply line level control circuit 20A via power supply lines VM[0], VM[1]. Power supply line VM[0] is connected in common to memory cells 1A-0, 1A-2, whereas power supply line VM[1] is connected in common to memory cells 1A-1, 1A-3.

Power supply line level control circuit 20A includes P-channel MOS transistors 21A, 22A connected to power supply line VM[0] and P-channel MOS transistors 23A, 24A connected to power supply line VM[1]. P-channel MOS transistor 21A is diode-connected to power supply line VM[0], while P-channel MOS transistor 23A is diode-connected to power supply line VM[1].

P-channel MOS transistors 21A to 24A have the sources provided with the power supply potential. P-channel MOS transistors 22A, 24A receive level control signals /CS[0], /CS[1] at their gates respectively.

Power supply line level control circuit 20A sets the potential level of power supply line VM[0] to a power supply potential VDD when level control signal /CS[0] is at L level, and sets the potential level of power supply line VM[0] to VDD-Vtp (Vtp represents a voltage between the gate and the source of a P-channel MOS transistor) when level control signal /CS[0] is at H level. Similarly, power supply line level control circuit 20A sets the potential level of power supply line VM[1] to power supply potential VDD when level control signal /CS[1] is at L level, and sets the potential level of power supply line VM[1] to VDD-Vtp when level control signal /CS[1] is at H level.

A specific circuit configuration of a memory cell 1A representing memory cells 1A-0, 1A-1, 1A-2, 1A-3 will now be described. Here, memory cell 1A is assumed to include control lines such as a write word line or a read bit line.

Figure 3:
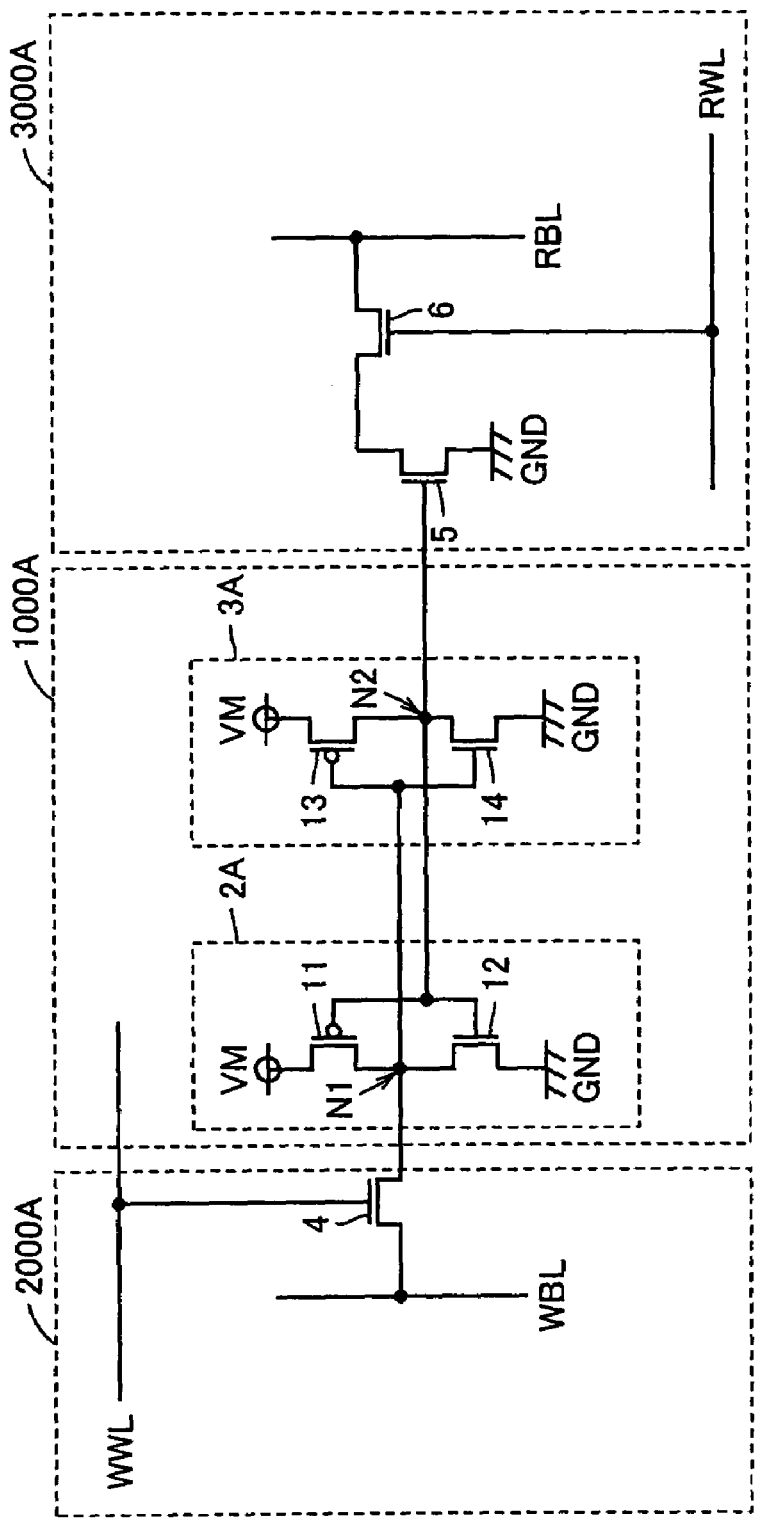
FIG. 3 is a circuit diagram showing a specific circuit configuration of a memory cell 1A in Embodiment 1 of the present invention.

FIG. 3 is a circuit diagram showing a specific circuit configuration of memory cell 1A in Embodiment 1 of the present invention.

Memory cell 1A in Embodiment 1 shown in FIG. 3 has a 2-port memory cell configuration, which is one example of a multi-port memory cell. Memory cell 1A includes a data storage portion 1000A, a write port 2000A, and a read port 3000A.

Data storage portion 1000A includes inverters 2A, 3A. Inverter 2A includes a P-channel MOS transistor 11 connected between power supply line VM and a storage node N1, and an N-channel MOS transistor 12 connected between storage node N1 and a ground line GND. Inverter 3A includes a P-channel MOS transistor 13 connected between power supply line VM and a storage node N2, and an N-channel MOS transistor 14 connected between storage node N2 and ground line GND.

The gates of P-channel MOS transistor 11 and N-channel MOS transistor 12 are both connected to storage node N2. The gates of P-channel MOS transistor 13 and N-channel MOS transistor 14 are both connected to storage node N1.

Write port 2000A includes an N-channel MOS transistor 4, a write word line WWL, and a write bit line WBL. N-channel MOS transistor 4 has its source connected to storage node N1, has its gate connected to write word line WWL, and has its drain connected to write bit line WBL.

Read port 3000A includes N-channel MOS transistors 5, 6, a read word line RWL, and a read bit line RBL. N-channel MOS transistor 5 has its source connected to ground line GND, has its gate connected to storage node N2, and has its drain connected to the source of N-channel MOS transistor 6. N-channel MOS transistor 6 has its source connected to the drain of N-channel MOS transistor 5, has its gate connected to read word line RWL, and has its drain connected to read bit line RBL.

As described above, memory cell 1A in Embodiment 1 has a 2-port memory cell configuration including write port 2000A and read port 3000A. Therefore, read bit line RBL is not electrically connected to storage nodes N1, N2. Accordingly, destruction of the storage data during the reading operation can be prevented, and stable reading operation can be achieved.

A detailed circuit operation of memory cell 1A will be described in detail with reference to FIGS. 4 and 5.

Figure 4:
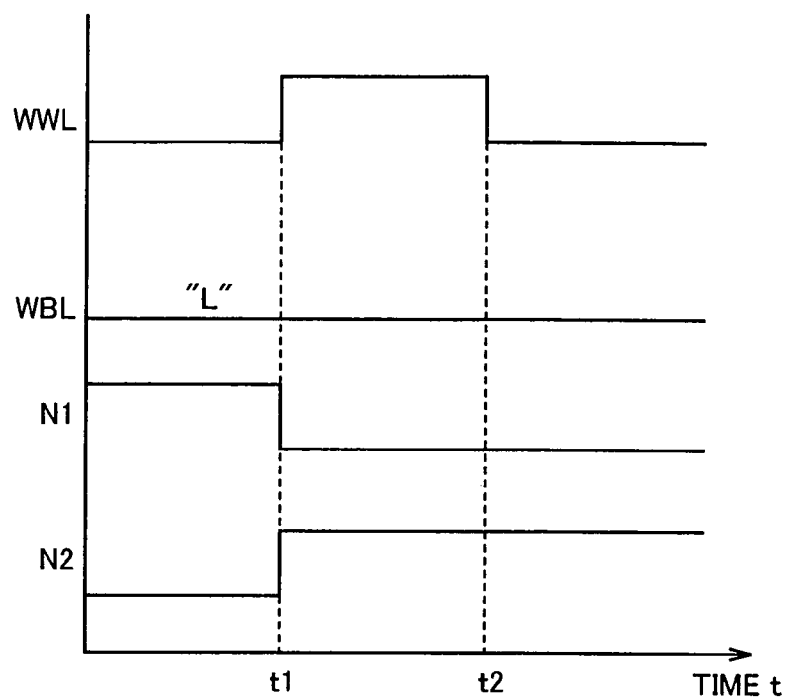
FIG. 4 is a timing chart for illustrating a writing operation at a write port 2000A of memory cell 1A in Embodiment 1 of the present invention.

FIG. 4 is a timing chart for illustrating a writing operation at write port 2000A of memory cell 1A in Embodiment 1 of the present invention.

Initially, before the writing operation, a not-shown drive circuit drives write bit line WBL to H level logic high) and L level (logic low) respectively when H level and L level are written into storage node N1 respectively.

When write word line WWL rises from L level to H level and the writing operation is started at time t1, N-channel MOS transistor 4 (access transistor) in FIG. 3 turns on, and write bit line WBL is electrically connected to storage node N1.

Here, as write bit line WBL is strongly driven, storage node N1 varies to a level of write bit line WBL regardless of a state of the held data. Storage node N2 varies to a level opposite to that of storage node N1. In FIG. 4, write bit line WBL is assumed to be driven to L level. Therefore, storage nodes N1, N2 attain L level and H level respectively at time t1.

When write word line WWL falls from H level to L level at time t2, N-channel MOS transistor 4 (access transistor) in FIG. 3 turns off, and write bit line WBL is electrically isolated from storage node N1.

In response to electrical isolation of write bit line WBL from storage node N1, storage nodes N1, N2 are stabilized at a lead-in level respectively. As a result, storage nodes N1, N2 holds each data, and the writing operation is completed.

Figure 5:
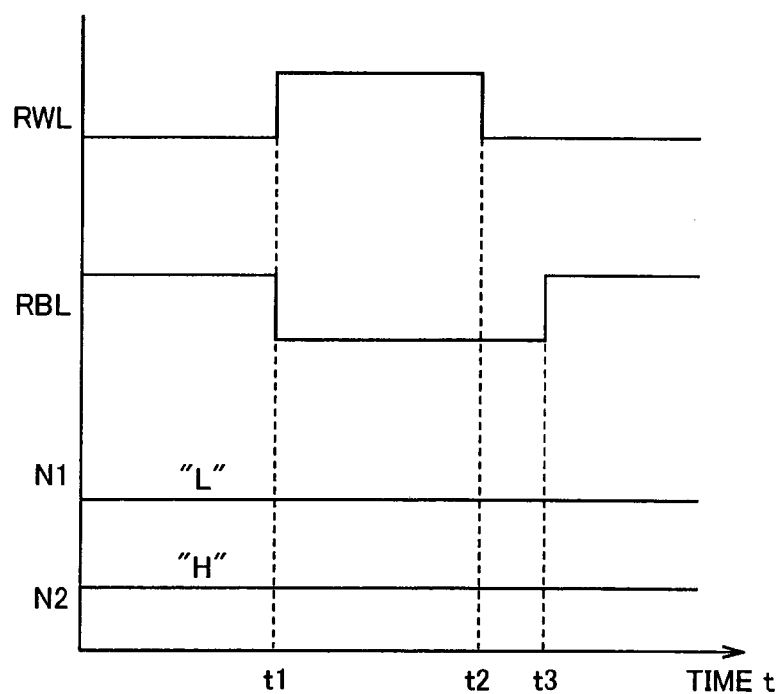
FIG. 5 is a timing chart for illustrating a reading operation at a read port 3000A of memory cell 1A in Embodiment 1 of the present invention.

FIG. 5 is a timing chart for illustrating a reading operation at read port 3000A of memory cell 1A in Embodiment 1 of the present invention.

Initially, before the reading operation, a not-shown precharge circuit precharges in advance read bit line RBL to H level. In the following, an example in which storage nodes N1, N2 are at L level and H level respectively will be described.

When read word line RWL rises from L level to H level and the reading operation starts at time t1, N-channel MOS transistor 6 in FIG. 3 turns on, and read bit line RBL is electrically connected to ground line GND because storage node N2 is also at H level. As a result, read bit line RBL attains L level, leading to reading of L level, which is an inverted level of storage node N2.

When read word line RWL falls from H level to L level at time t2, N-channel MOS transistor 6 in FIG. 3 turns off, and read bit line RBL is electrically isolated from ground line GND.

At time t3, read bit line RBL is again precharged to H level for a next reading operation, and the reading operation is completed.

If storage nodes N1, N2 are at H level and L level respectively, read bit line RBL is not electrically connected to ground line GND even if read word line RWL rises from L level to H level. This is because storage node N2 is at L level. Therefore, read bit line RBL maintains H level, leading to reading of H level, which is an inverted level of storage node N2.

An operation of memory cell array 110A of which circuit configuration has been described in conjunction with FIG. 2 will now be described in detail.

First, an operation of memory cell array 110A during waiting in which neither writing nor reading is performed will be described.

Referring to FIG. 2, in memory cell array 110A during waiting, write word lines WWLA[0], WWLA[1], WVVLB[0], WWLB[1] and read word lines RWL[0], RWL[1] are all set to L level. In other words, none of memory cells 1A-0, 1A-1, 1A-2, 1A-3 is selected during waiting.

During waiting, level control signals /CS[0], /CS[1] are both set to H level.

By setting both of level control signals /CS[0], /CS[1] to H level, P-channel MOS transistors 22A, 24A both enter off state. In response to this, the gate leakage current flows in an MOS transistor within memory cells 1A-0, 1A-1, 1A-2, 1A-3, and power supply lines VM[0], VM[1] are both stabilized at a potential as low as VDD-Vtp (Vtp is a voltage between the gate and the source of a P-channel MOS transistor).

A relation between the gate leakage current as above and the gate voltage (generic name of the voltage between the gate and the source and the voltage between the gate and the drain) will be described with reference to FIG. 6.

Figure 6:
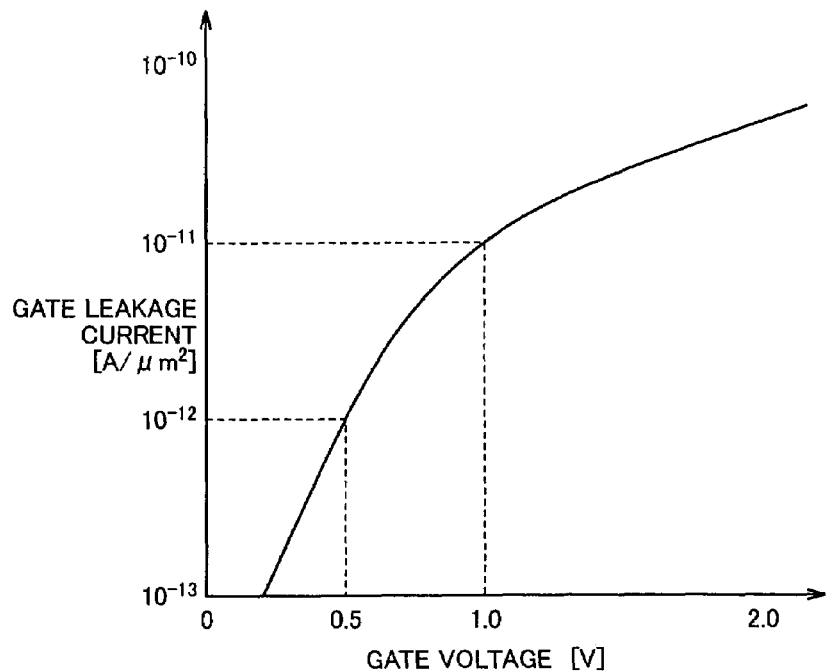
FIG. 6 is a graph showing one example of a relation between a gate leakage current and a gate voltage in an MOS transistor.

FIG. 6 is a graph showing one example of a relation between the gate leakage current and the gate voltage in an MOS transistor.

The graph in FIG. 6 shows an example in which a gate oxide film of the MOS transistor has a thickness of 20 Å, wherein the abscissa represents the gate voltage (unit: V), and the ordinate represents the gate leakage current (unit: $A/\mu m^2$) that flows per unit gate area. Note that the ordinate is represented by logarithmic scale.

As shown in FIG. 6, though the gate leakage current attains $10^{-11} A/\mu m^2$ when the gate voltage is set to 1.0V, the gate leakage current is reduced by one digit to $10^{-12} A/\mu m^2$ when the gate voltage is lowered to 0.5V. In this manner, since the gate leakage current exponentially varies with respect to the gate voltage, slight lowering of the gate voltage will result in significant reduction in the gate leakage current.

Referring to FIG. 3, if storage node N2 of memory cell 1A is at H level for example, the gate leakage current flows from each gate terminal of N-channel MOS transistors 5, 12 to ground line GND. If the potential of power supply line VM should fall from 1.0V to 0.5V, the gate leakage current in N-channel MOS transistors 5, 12 is reduced by one digit.

Therefore, referring to FIG. 2, by setting level control signals /CS[0], /CS[1] to H level so as to lower the potential of power supply lines VM[0], VM[1] to VDD-Vtp, the gate leakage current in memory cell array 110A during waiting can significantly be reduced. Thus, power consumption of memory cell array 110A during waiting can significantly be reduced.

A writing operation of memory cell array 110A will now be described with reference to FIG. 2.

When data is written into memory cell 1A-0 for example, write bit line WBL[0] is selected by a column address signal, and write bit line WBL[0] is driven to a desired value. In succession, write word line WWLA[0] is selected by a column address signal and a row address signal and set to H level, whereby desired data is written into memory cell 1A-0.

When data is written into memory cell 1A-1, write bit line WBL[1] is selected by a column address signal, and write bit line WBL[1] is driven to a desired value. In succession, write word line WWLB[0] is selected by a column address signal and a row address signal and set to H level, whereby desired data is written into memory cell 1A-1.

In this writing operation, level control signals /CS[0], /CS[1] are both set to H level.

By setting both of level control signals /CS[0], /CS[1] to H level, the gate leakage current flows in the MOS transistor within memory cells 1A-0, 1A-1, 1A-2, 1A-3, and power supply lines VM[0], VM[1] are both stabilized at a potential as low as VDD-Vtp (Vtp is a voltage between the gate and the source of a P-channel MOS transistor).

Therefore, by setting level control signals /CS[0], /CS[1] to H level so as to lower the potential of power supply lines VM[0], VM[1] to VDD-Vtp, the gate leakage current during writing operation of memory cell array 110A can significantly be reduced. Thus, power consumption during writing operation of memory cell array 110A can significantly be reduced.

A reading operation of memory cell array 110A will now be described. In the following, an example in which data in memory cell 1A-0 is read will be described with reference to FIGS. 7 and 8.

Figure 7:
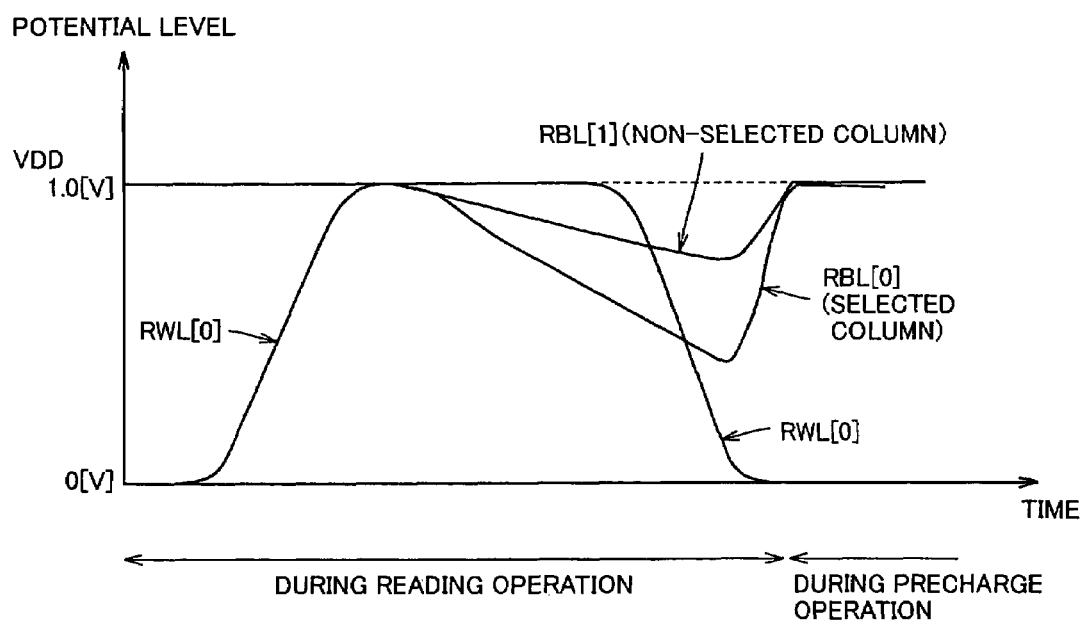
FIG. 7 shows potential change of a read word line RWL[0] and read bit lines RBL[0], RBL[1] in memory cell array 110A in Embodiment 1.

FIG. 7 shows potential change of read word line RWL[0] and read bit lines RBL[0], RBL[1] in memory cell array 110A in Embodiment 1.

When data in memory cell 1A-0 is read, read word line RWL[0] is selected by a row address signal and set to H level (power supply potential VDD) as shown in FIG. 7. Desired data is thus read to read bit line RBL[0]. Power supply potential VDD is set to 1.0V, for example.

Note that read word line RWL[0] is also connected to memory cell 1A-1, which is a memory cell in a non-read column and in the same row, as shown in FIG. 2. Therefore, when the data in memory cell 1A-0 is read to read bit line RBL[0], the data in memory cell 1A-1 is simultaneously read to read bit line RBL[1].

In memory cell array 110A in Embodiment 1, each data in memory cells 1A-0, 1A-1 that has been read simultaneously is input to a not-shown selector circuit. By selecting the data of one read bit line designated by a column address signal, desired data is read.

Meanwhile, as described with reference to FIG. 5, the reading operation of memory cell 1A is performed after the read bit line is precharged in advance to H level.

Accordingly, when the data at H level is read to read bit line RBL[0] (when storage node N2 in FIG. 3 is at L level), the level of read bit line RBL[0] is not varied by the reading operation. On the other hand, when the data at L level is read to read bit line RBL[0] (when storage node N2 in FIG. 3 is at H level), the level of read bit line RBL[0] varies from H level to L level by the reading operation.

Here, desirably, the potential level of read bit line RBL[0] of a data read column varies rapidly in order to attain higher speed in the reading operation. On the other hand, desirably, the potential level of read bit line RBL[1] of a data non-read column does not vary, in order to suppress the charging/discharging current to reduce power consumption.

In memory cell array 110A in Embodiment 1, during the reading operation, level control signal /CS[0] controlling the potential level of power supply line VM[0] of the data read column is set to L level, and level control signal /CS[1] controlling the potential level of power supply line VM[1] of the data non-read column is set to H level, respectively.

Figure 8:
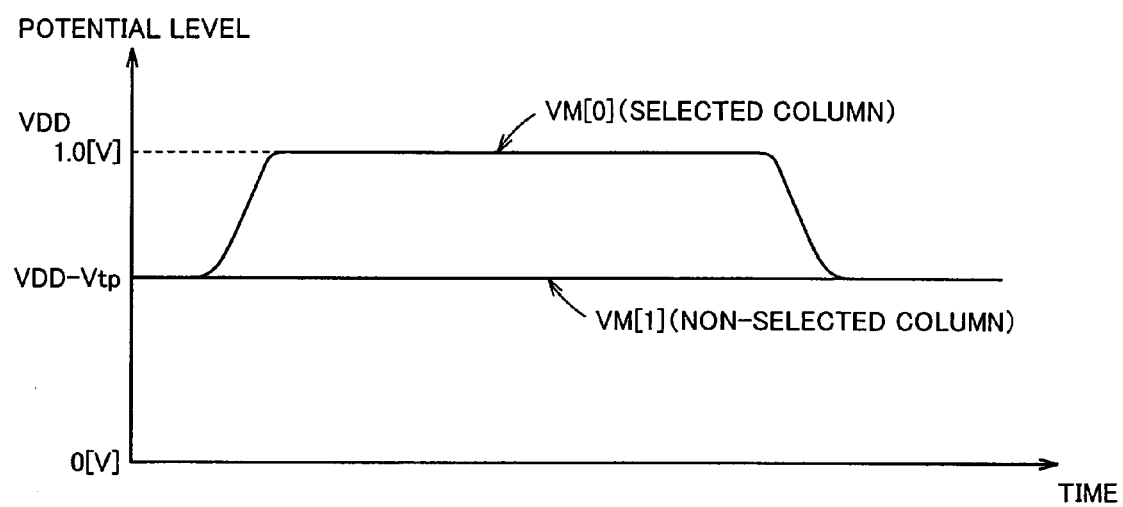
FIG. 8 shows potential change of power supply lines VM[0], VM[1] in memory cell array 110A in Embodiment 1.

FIG. 8 shows potential change of power supply lines VM[0], VM[1] in memory cell array 110A in Embodiment 1.

By setting level control signals /CS[0], /CS[1] to L level and H level respectively, in the reading operation, the potential level at power supply line VM[0] in the data read column (selected column) is set to power supply potential VDD, and the potential level at power supply line VM[1] in the data non-read column (non-selected column) is set to VDD-Vtp (Vtp is the voltage between the gate and the source of a P-channel MOS transistor), as shown in FIG. 8.

Therefore, the potential level of storage node N2 in FIG. 3 in selected memory cell 1A-0 is set to power supply potential VDD, and a voltage of power supply potential VDD is applied between the gate and the source of N-channel MOS transistor 5 for reading in FIG. 3. Generally, the higher the voltage between the gate and the source is, the higher the drivability of an MOS transistor will be. Therefore, data of read bit line RBL[0] in the data read column is rapidly pulled.

Consequently, referring to FIG. 7, the potential level of read bit line RBL[0] in the data read column (selected column) is lowered significantly during the reading operation.

On the other hand, the potential level of storage node N2 in FIG. 3 in non-selected memory cell 1A-1 is set to VDD-Vtp, and a voltage of VDD-Vtp is applied between the gate and the source of N-channel MOS transistor 5 for reading in FIG. 3. As non-selected memory cell 1A-1 has the voltage between the gate and the source of N-channel MOS transistor 5 for reading lower than that of selected memory cell 1A-0, the data of read bit line RBL[1] in the data non-read column is pulled slowly.

Consequently, referring to FIG. 7, the potential level of read bit line RBL[1] in the data non-read column (non-selected column) is not lowered significantly during the reading operation.

When the potential change of read bit line RBL[0] is transmitted to data output and the reading operation is completed, the potential level of read bit lines RBL[0], RBL[1] returns to H level by precharging, as shown in FIG. 7.

Here, read bit line RBL[1] in the data non-read column of which potential level is not lowered significantly during the reading operation can return to H level with a small amount of charging current during a precharge operation.

In this manner, level control signals /CS[0], /CS[1] are set to L level and H level respectively, and the potential of power supply lines VM[0], VM[1] is set to VDD and VDD-Vtp respectively. Thus, power consumption during the reading operation of memory cell array 110A can be reduced.

When the reading operation is completed, level control signal /CS[0] is returned to H level in order to reduce power consumption by the gate leakage current, and P-channel MOS transistor 22A in FIG. 2 that has driven the potential level of power supply line VM[0] to power supply potential VDD is turned off. Accordingly, the potential level of power supply line VM[0] is gradually lowered to the level of VDD-Vtp and stabilized thereat, as shown in FIG. 8.

As described above, according to Embodiment 1, separate write word line is allocated to respective memory cell even if memory cells are located in the same row, and the potential of the power supply line is controlled in response to the level control signal. In this manner, power consumption by the charging/discharging current of the bit line or the like as well as by the gate leakage current of the memory cell in the non-selected column can be reduced.

Embodiment 2

Figure 9:
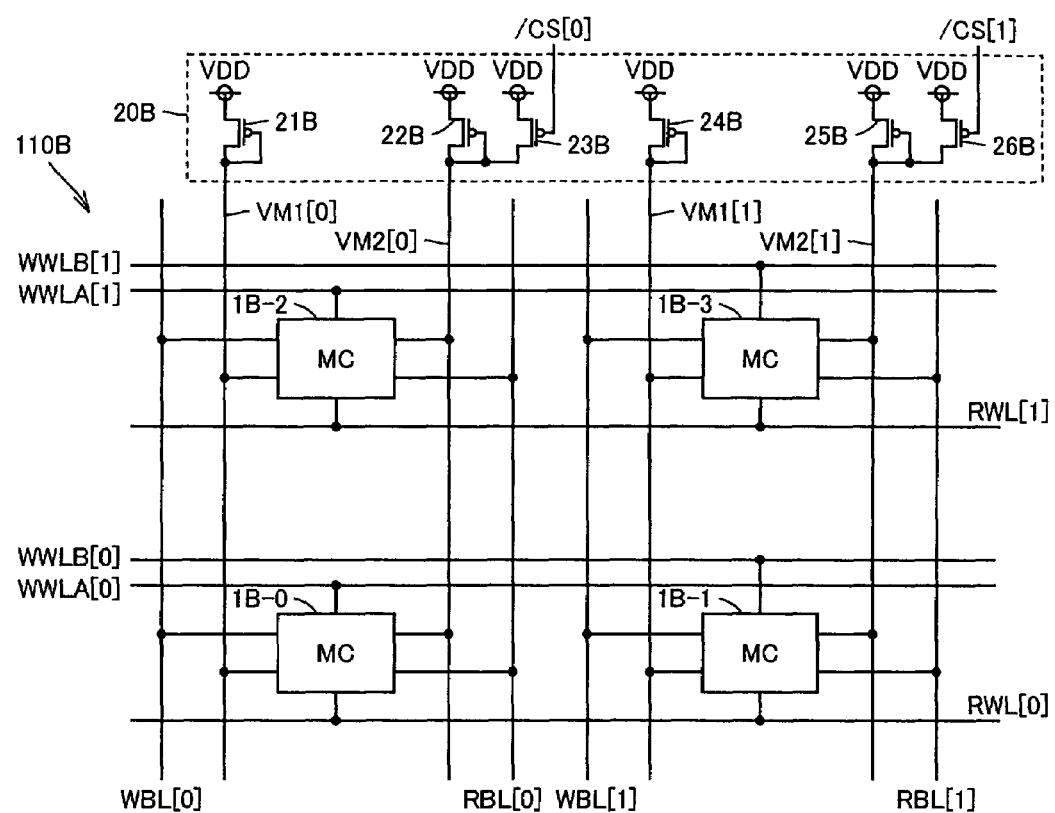
FIG. 9 is a circuit diagram showing a circuit configuration of a memory cell array 110B and its periphery in Embodiment 2 of the present invention.

FIG. 9 is a circuit diagram showing a circuit configuration of a memory cell array 110B and its periphery in Embodiment 2 of the present invention.

Referring to FIG. 9, memory cell array 110B in Embodiment 2 includes memory cells 1B-0, 1B-1, 1B-2, 1B-3 arranged in matrix of rows and columns, write word lines WWLA[0], WWLA[1], WWLB[0], WWLB[1] and read word lines RWL[0], RWL[1] arranged in a direction of row, and write bit lines WBL[0], WBL[1] and read bit lines RBL[0], RBL[1] arranged in a direction of column.

As a connection relation of the write word line, the read word line, the write bit line, and the read bit line to each memory cell is similar to that in memory cell array 110A in Embodiment 1, description thereof will not be repeated.

Memory cell array 110B in Embodiment 2 is connected to a power supply line level control circuit 20B via power supply lines VM1[0], VM2[0], VM1[1], VM2[1]. Each of power supply lines VM1[0], VM2[0] is connected in common to memory cells 1B-0, 1B-2, while each of power supply lines VM[1], VM2[1] is connected in common to memory cells 1B-1, 1B-3.

Power supply line level control circuit 20B includes a P-channel MOS transistor 21B connected to power supply line VM1[0], P-channel MOS transistors 22B, 23B connected to power supply line VM2[0], a P-channel MOS transistor 24B connected to power supply line VM1[1], and P-channel MOS transistors 25B, 26B connected to power supply line VM2[1].

P-channel MOS transistor 21B is diode-connected to power supply line VM1[0]. P-channel MOS transistor 22B is diode-connected to power supply line VM2[0]. P-channel MOS transistor 24B is diode-connected to power supply line VM1[1]. P-channel MOS transistor 25B is diode-connected to power supply line VM2[1].

P-channel MOS transistors 21B to 26B have the sources provided with power supply potential VDD. P-channel MOS transistors 23B, 26B receive level control signals /CS[0], /CS[1] at their gates respectively.

Power supply line level control circuit 20B sets the potential level of power supply line VM2[0] to power supply potential VDD when level control signal /CS[0] is at L level, and sets the potential level of power supply line VM2[0] to VDD-Vtp (Vtp represents a voltage between the gate and the source of a P-channel MOS transistor) when level control signal /CS[0] is at H level. Similarly, power supply line level control circuit 20B sets the potential level of power supply line VM2[1] to power supply potential VDD when level control signal /CS[1] is at L level, and sets the potential level of power supply line VM2[1] to VDD-Vtp when level control signal /CS[1] is at H level. On the other hand, each potential of power supply lines VM1[0], VM1[1] is fixed to VDD-Vtp.

A specific circuit configuration of a memory cell 1B representing memory cells 1B-0, 1B-1, 1B-2, 1B-3 will now be described. Here, memory cell 1B is assumed to include control lines such as a write word line or a read bit line. With regard to the circuit operation of memory cell 1B and memory cell array 110B in Embodiment 2, description of portions the same as those in Embodiment 1 will not be repeated.

Figure 10:
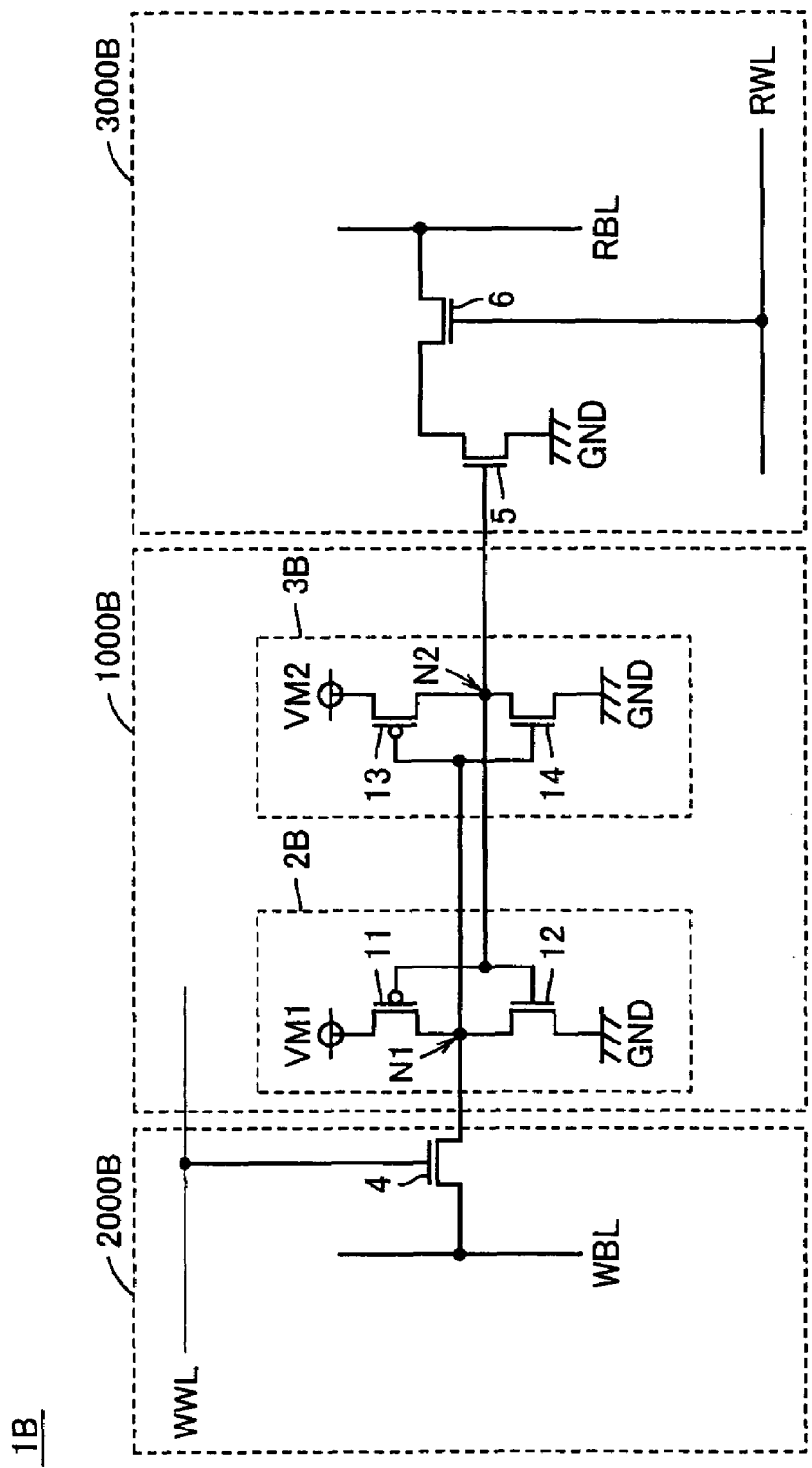
FIG. 10 is a circuit diagram showing a specific circuit configuration of a memory cell 1B in Embodiment 2 of the present invention.

FIG. 10 is a circuit diagram showing a specific circuit configuration of memory cell 1B in Embodiment 2 of the present invention.

Referring to FIG. 10, memory cell 1B in Embodiment 2 includes a data storage portion 1000B, a write port 2000B, and a read port 3000B. Data storage portion 1000B includes inverters 2B, 3B. Here, as write port 2000B and read port 3000B are identical to write port 2000A and read port 3000A in Embodiment 1 respectively, description thereof will not be repeated.

Data storage portion 1000B in Embodiment 2 is different from data storage portion 1000A in Embodiment 1 only in that power supply line VM1 having a fixed potential level is connected to inverter 2B, and power supply line VM2 of which potential level can be controlled is connected to inverter 3B. Even when the potential of power supply line VM1 is fixed, this merely means that the potential of storage node N1 is fixed. Therefore, the potential of storage node N2 affecting the reading speed can be controlled in a manner the same as in Embodiment 1.

In this manner, whereas power supply line VM in Embodiment 1 is connected in common to inverters 2B, 3B, power supply lines VM1, VM2 in Embodiment 2 are individually connected to inverters 2B, 3B respectively. Therefore, load capacitance onto power supply lines VM1, VM2 in Embodiment 2 is made smaller than that onto power supply line VM in Embodiment 1.

Thus, in memory cell array 110B in Embodiment 2, when the potential level of the power supply line in the data read column (selected column) is raised from VDD-Vtp to VDD during reading operation as described in FIG. 8, required power consumption can be reduced, and the rising speed of the potential level is improved.

In addition, though H level at storage node N1 in Embodiment 1 has been power supply potential VDD, H level at storage node N1 in Embodiment 2 is the potential level of VDD-Vtp even during the reading operation.

Therefore, memory cell array 110B in Embodiment 2 can reduce the gate leakage current caused by storage node N1 set to H level even during the reading operation.

As described above, according to Embodiment 2, the power supply line is divided into two lines, and the potential level of only one of those lines is allowed for control. In this manner, power consumption by the charging/discharging current of the bit line or the like as well as by the gate leakage current in the memory cell in the non-selected column can be reduced.

Embodiment 3

Figure 11:
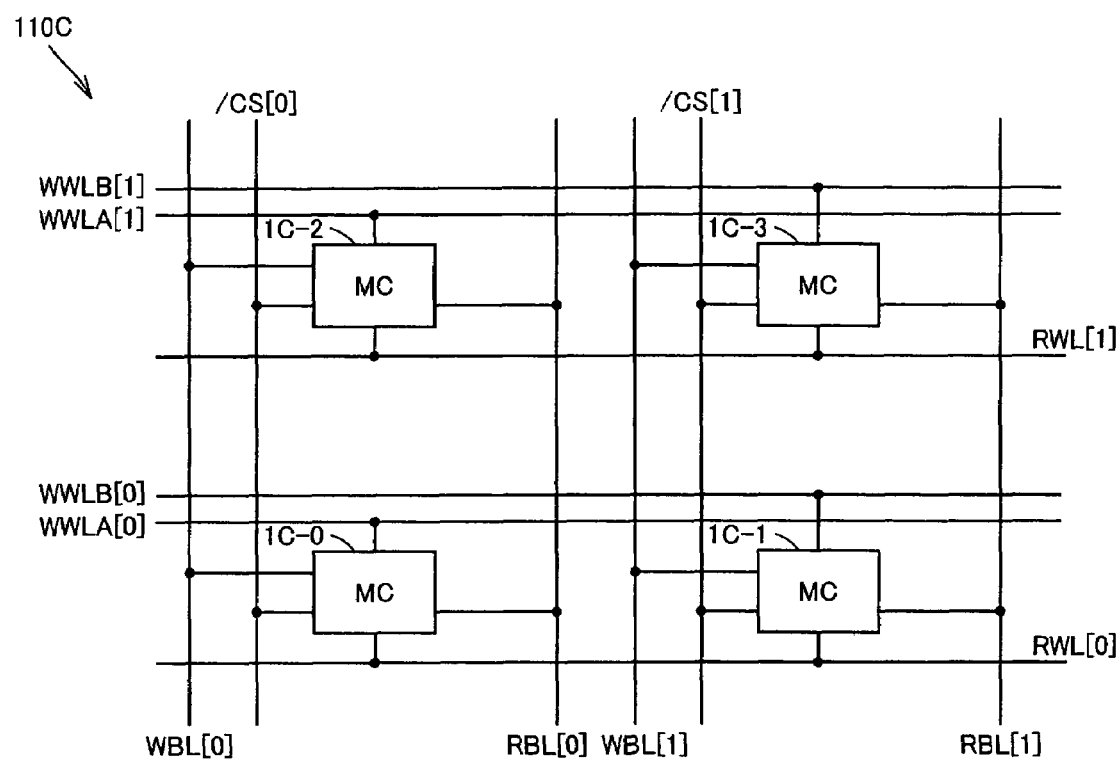
FIG. 11 is a circuit diagram showing a circuit configuration of a memory cell array 110C in Embodiment 3 of the present invention.

FIG. 11 is a circuit diagram showing a circuit configuration of a memory cell array 110C in Embodiment 3 of the present invention.

Referring to FIG. 11, memory cell array 110C in Embodiment 3 includes memory cells 1C-0, 1C-1, 1C-2, 1C-3 arranged in matrix of rows and columns, write word lines WWLA[0], WWLA[1], WWLB[0], WLB[1] and read word lines RWL[0], RWL[1] arranged in a direction of row, and write bit lines WBL[0], WBL[1] and read bit lines RBL[0], RBL[1] arranged in a direction of column.

As a connection relation of the write word line, the read word line, the write bit line, and the read bit line to each memory cell is similar to that in memory cell array 110A in Embodiment 1, description thereof will not be repeated.

In memory cell array 110C in Embodiment 3, level control signals /CS[0], /CS[1] are directly input to memory cells 1C-0, 1C-1, 1C-2, 1C-3. Level control signal /CS[0] is input in common to memory cells 1C-0, 1C-2, while level control signal /CS[1] is input in common to memory cells 1C-1, 1C-3.

A specific circuit configuration of a memory cell 1C representing memory cells 1C-0, 1C-1, 1C-2, 1C-3 will now be described. Here, memory cell 1C is assumed to include control lines such as a write word line or a read bit line. With regard to the circuit operation of memory cell 1C and memory cell array 110C in Embodiment 3, description of portions the same as those in Embodiment 1 will not be repeated.

Figure 12:
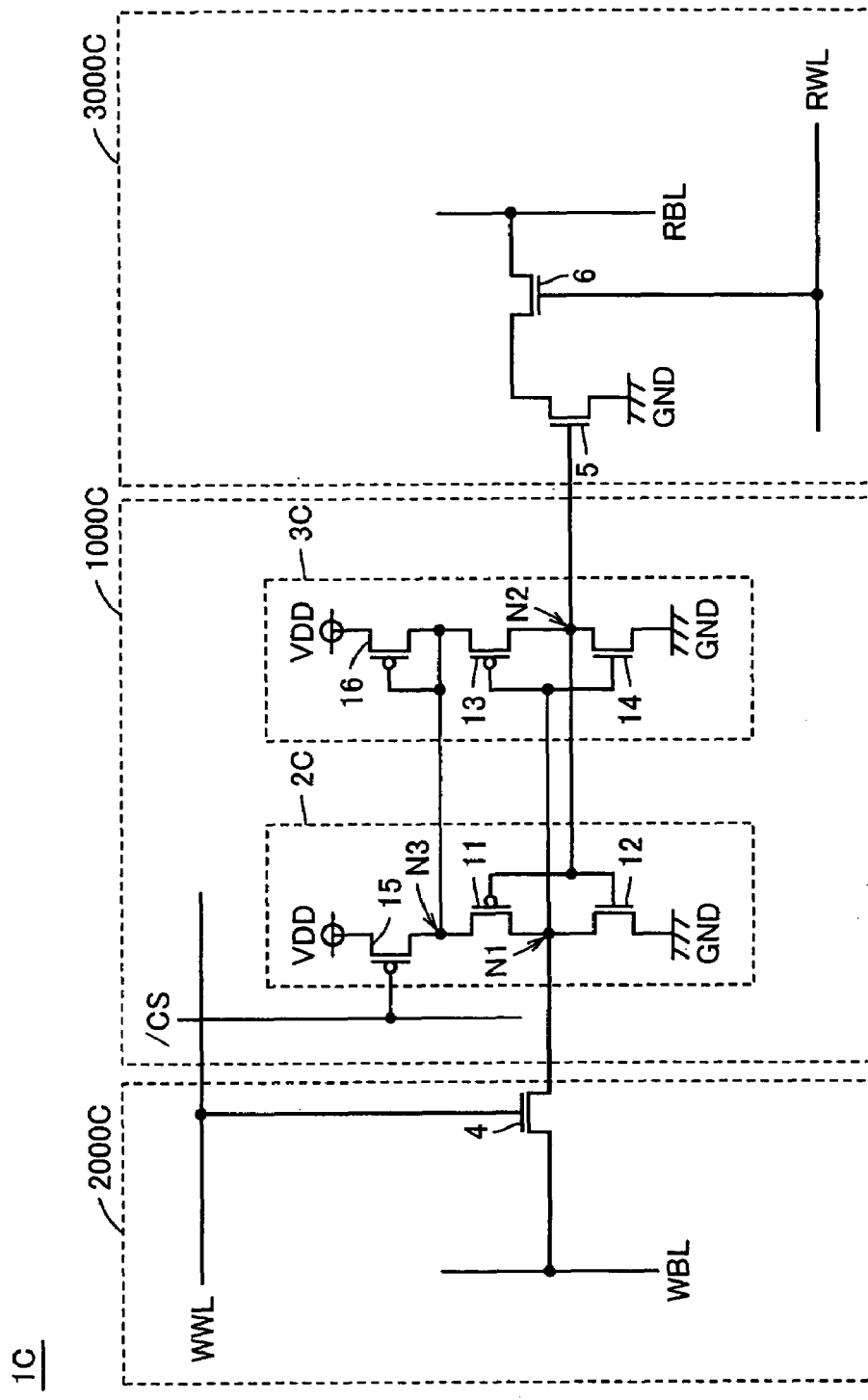
FIG. 12 is a circuit diagram showing a specific circuit configuration of a memory cell 1C in Embodiment 3 of the present invention.

FIG. 12 is a circuit diagram showing a specific circuit configuration of memory cell 1C in Embodiment 3 of the present invention.

Referring to FIG. 12, memory cell 1C in Embodiment 3 includes a data storage portion 1000C, a write port 2000C, and a read port 3000C. Here, as write port 2000C and read port 3000C are identical to write port 2000A and read port 3000A in Embodiment 1 respectively, description thereof will not be repeated.

Data storage portion 1000C includes inverters 2C, 3C. Inverter 2C includes P-channel MOS transistor 11 connected between a node N3 and storage node N1, N-channel MOS transistor 12 connected between storage node N1 and ground node GND, and P-channel MOS transistor 15 connected between power supply node VDD to which power supply potential VDD is provided and node N3.

Inverter 3C includes P-channel MOS transistor 13 connected between node N3 and storage node N2, N-channel MOS transistor 14 connected between storage node N2 and ground node GND, and P-channel MOS transistor 16 diode-connected between power supply node VDD to which power supply potential VDD is provided and node N3.

The gates of P-channel MOS transistor 11 and N-channel MOS transistor 12 are both connected to storage node N2. The gates of P-channel MOS transistor 13 and N-channel MOS transistor 14 are both connected to storage node N1. P-channel MOS transistor 15 receives a level control signal /CS linked to the column address signal, the write control signal, and the read control signal at its gate.

Referring to FIG. 12, when level control signal /CS is at L level, P-channel MOS transistor 15 turns on, and the potential of node N3 attains power supply potential VDD. Accordingly, one potential higher than another of storage nodes N1 and N2 attains power supply potential VDD.

On the other hand, when level control signal /CS is at H level, P-channel MOS transistor 15 turns off. Therefore, the potential of node N3 gradually lowers, and is stabilized at a level lowered by Vtp, that is, the voltage between the gate and the source of P-channel MOS transistor 16. In other words, as the potential of node N3 attains VDD-Vtp, one potential higher than another of storage nodes N1 and N2 attains VDD-Vtp.

In memory cell array 110C in Embodiment 3, level control signals /CS[0], /CS[1] are set to L level and H level respectively during the reading operation of memory cell 1C-0, as in Embodiment 1.

In this manner, since the potential level of node N3 and storage node N2 in memory cells 1C-0, 1C-2 in the data read column attains power supply potential VDD, high-speed reading operation is achieved.

On the other hand, since the potential level of node N3 and storage node N2 in memory cells 1C-1, 1C-3 in the data non-read column attains VDD-Vtp, power consumption by the gate leakage current can be reduced.

When storage node N2 in memory cell 1C-1 is at H level, data of read bit line RBL[1] is pulled slowly, as described in connection with FIG. 7 of Embodiment 1. Therefore, the potential level is not significantly lowered during the reading operation, and the charging/discharging current can be suppressed.

In addition, during the writing operation and waiting, as the potential level of node N3 is lowered to VCC-Vtp in all memory cells 1C-0, 1C-1, 1C-2, 1C-3, the gate leakage current can be reduced.

As described above, according to Embodiment 3, the level control signal is directly input to the memory cell so as to control the potential level of the storage node. In this manner, power consumption by the charging/discharging current of the bit line or the like as well as by the gate leakage current of the memory cell in the non-selected column can be reduced.

Embodiment 4

Figure 13:
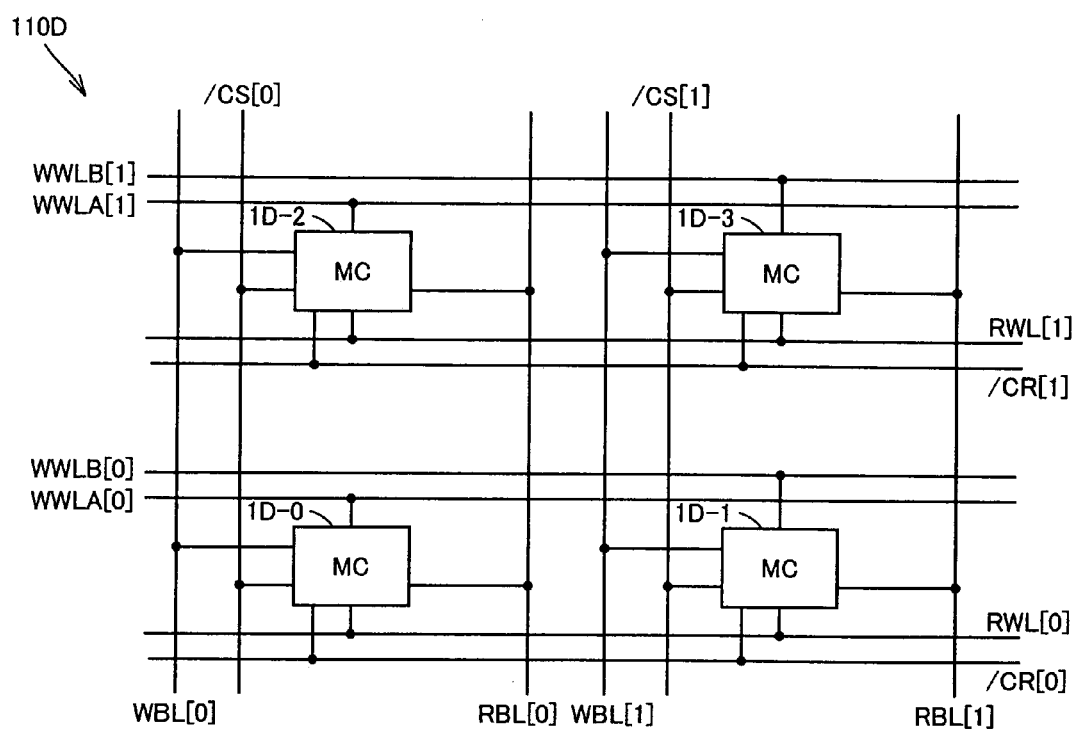
FIG. 13 is a circuit diagram showing a circuit configuration of a memory cell array 110D in Embodiment 4 of the present invention.

FIG. 13 is a circuit diagram showing a circuit configuration of a memory cell array 110D in Embodiment 4 of the present invention.

Referring to FIG. 13, memory cell array 110D in Embodiment 0.4 includes memory cells 1D-0, 1D-1, 1D-2, 1D-3 arranged in matrix of rows and columns, write word lines WWLA[0], WWLA[1], WWLB[0], WWLB[1] and read word lines RWL[0], RWL[1] arranged in a direction of row, and write bit lines WBL[0], WBL[1] and read bit lines RBL[0], RBL[1] arranged in a direction of column.

As a connection relation of the write word line, the read word line, the write bit line, and the read bit line to each memory cell is similar to that in memory cell array 110A in Embodiment 1, description thereof will not be repeated.

In memory cell array 110D in Embodiment 4, second level control signals /CR[0], /CR[1] in addition to level control signals /CS[0], /CS[1] are input to memory cells 1D-0, 1D-1, 1D-2, 1D-3.

Level control signal /CS[0] is input in common to memory cells 1D-0, 1D-2, while level control signal /CS[1] is input in common to memory cells 1D-1, 1D-3. Second level control signal /CR[0] is input in common to memory cells 1D-0, 1D-1, while second level control signal /CR[1] is input in common to memory cells 1D-2, 1D-3.

A specific circuit configuration of a memory cell 1D representing memory cells 1D-0, 1D-1, 1D-2, 1D-3 will now be described. Here, memory cell 1D is assumed to include control lines such as a write word line or a read bit line. With regard to the circuit operation of memory cell 1D and memory cell array 110D in Embodiment 4, description of portions the same as those in Embodiment 1 will not be repeated.

Figure 14:
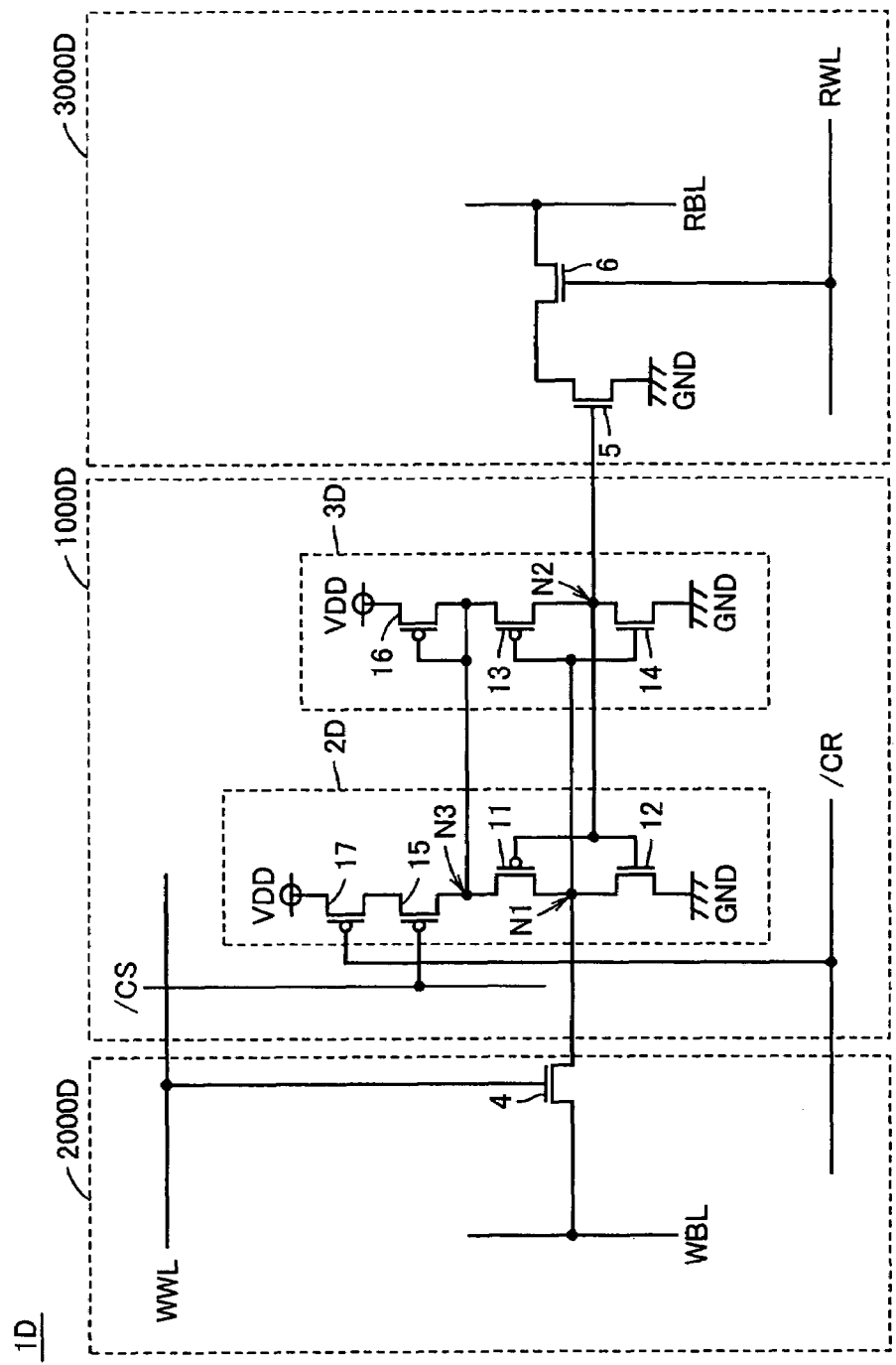
FIG. 14 is a circuit diagram showing a specific circuit configuration of a memory cell 1D in Embodiment 4 of the present invention.

FIG. 14 is a circuit diagram showing a specific circuit configuration of memory cell 1D in Embodiment 4 of the present invention.

Referring to FIG. 14, memory cell 1D in Embodiment 4 includes a data storage portion 1000D, a write port 2000D, and a read port 3000D. Here, as write port 2000D and read port 3000D are identical to write port 2000A and read port 3000A in Embodiment 1 respectively, description thereof will not be repeated.

Data storage portion 1000D includes inverters 2D, 3D. Inverter 2D includes P-channel MOS transistor 11 connected between node N3 and storage node N1, N-channel MOS transistor 12 connected between storage node N1 and ground node GND, and P-channel MOS transistors 15, 17 connected in series between power supply node VDD to which power supply potential VDD is provided and node N3.

P-channel MOS transistor 15 receives level control signal /CS linked to the column address signal, the write control signal, and the read control signal at its gate. P-channel MOS transistor 17' receives level control signal /CS linked to the row address signal, the write control signal, and the read control signal at its gate.

Inverter 3D includes P-channel MOS transistor 13 connected between node N3 and storage node N2, N-channel MOS transistor 14 connected between storage node N2 and ground node GND, and P-channel MOS transistor 16 diode-connected between power supply node VDD to which power supply potential VDD is provided and node N3.

The gates of P-channel MOS transistor 11 and N-channel MOS transistor 12 are both connected to storage node N2. The gates of P-channel MOS transistor 13 and N-channel MOS transistor 14 are both connected to storage node N1.

Referring to FIG. 14, when level control signal /CS and second level control signal /CR are both at L level, P-channel transistors 15, 17 both turn on, and node N3 attains power supply potential VDD. Therefore, one potential higher than another of storage nodes N1 and N2 attains power supply potential VDD.

On the other hand, when level control signal /CS or second level control signal /CR is at H level, either of P-channel transistors 15, 17 turns off. Specifically, when level control signal /CS is at H level, P-channel MOS transistor 15 turns off, and when second level control signal /CR is at H level, P-channel MOS transistor 17 turns off.

As such, the potential of node N3 gradually lowers, and is stabilized at a level lowered by Vtp, that is, the voltage between the gate and the source of P-channel MOS transistor 16. In other words, as the potential of node N3 attains VDD-Vtp, one potential higher than another of storage nodes N1 and N2 attains VDD-Vtp.

In memory cell array 110D in Embodiment 4, level control signal /CS[0] and second level control signal /CR[0] are set to L level in the reading operation of memory cell 1D-0, so as to select a row and a column of memory cell 1D-0 from which data is read. In contrast, corresponding to a row and a column from which data is not read, level control signal /CS[1] and second level control signal /CR[1] are set to H level.

Thus, since the potential level of node N3 and storage node N2 in memory cell 1D-0 from which the data is read attains power supply potential VDD, high-speed reading operation is achieved.

On the other hand, as the potential level of node N3 and storage node N2 in memory cells 1D-1, 1D-2, 1D-3 from which the data is not read attains VDD-Vtp, power consumption by the gate leakage current can be reduced.

The potential level of node N3 and storage node N2 in the memory cell in the data read column has all attained power supply potential VDD in memory cell array 100C in Embodiment 3. In memory cell array 10D of Embodiment 4, however, the potential level of node N3 and storage node N2 in the memory cell in a data non-read row attains VDD-Vtp even if that memory cell is in the data read column. Therefore, power consumption by the gate leakage current can further be reduced in Embodiment 4, compared with Embodiment 3.

When storage node N2 in memory cell 1D-1 is at H level, the data of read bit line RBL[1] is slowly pulled, as described in connection with FIG. 7 of Embodiment 1. Therefore, the potential level is not significantly lowered during the reading operation, and the charging/discharging current can be suppressed.

In addition, during the writing operation and waiting, as the potential level of node N3 is lowered to VCC-Vtp in all memory cells 1D-0, 1D-1, 1D-2, 1D-3, the gate leakage current can be reduced.

As described above, according to Embodiment 4, the level control signal corresponding to a row and a column respectively is directly input to the memory cell so as to control the potential level of the storage node. In this manner, power consumption by the charging/discharging current of the bit line or the like as well as by the gate leakage current of the memory cell in the non-selected column can be reduced.

Embodiment 5

Figure 15:
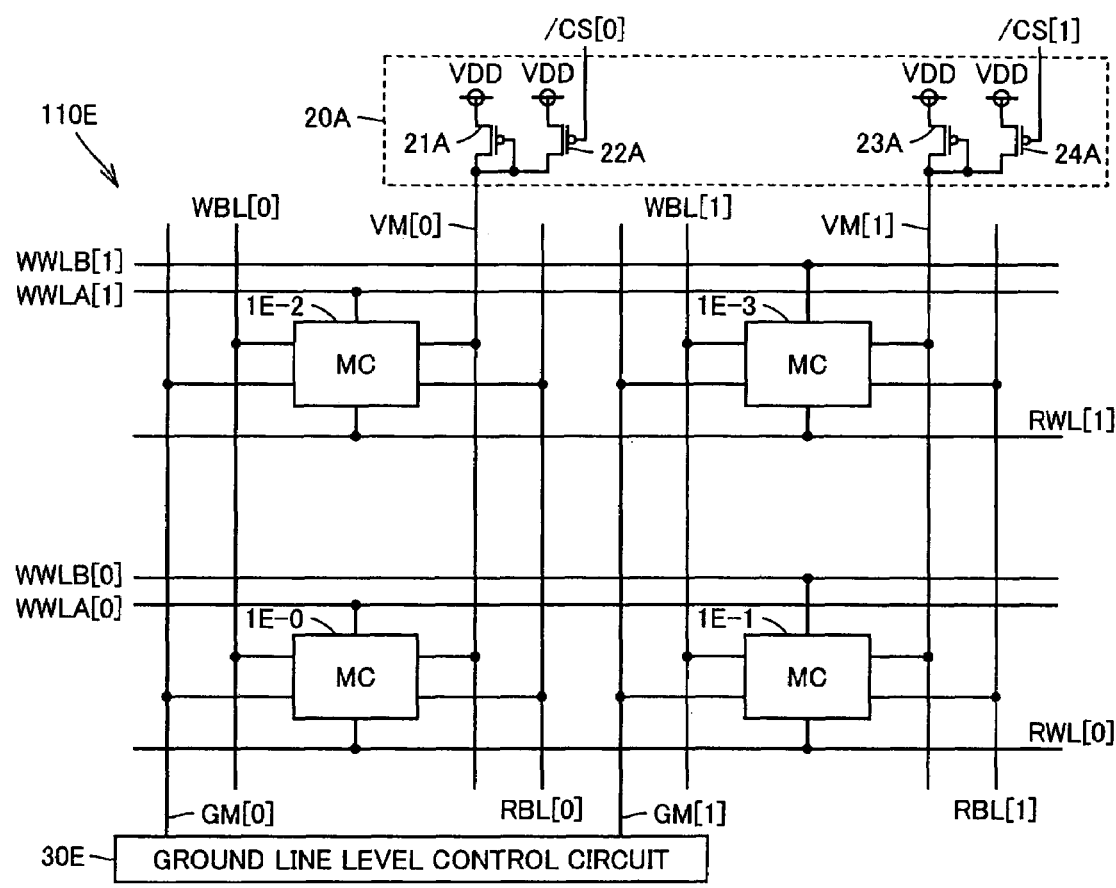
FIG. 15 is a circuit diagram showing a circuit configuration of a memory cell array 110E and its periphery in Embodiment 5 of the present invention.

FIG. 15 is a circuit diagram showing a circuit configuration of a memory cell array 10E and its periphery in Embodiment 5 of the present invention.

Referring to FIG. 15, memory cell array 110E in Embodiment 5 includes memory cells 1E-0, 1E-1, 1E-2, 1E-3 arranged in matrix of rows and columns, write word lines WWLA[0], WWLA[1], WWLB[0], WWLB[1] and read word lines RWL[0], RWL[1] arranged in a direction of row, and write bit lines WBL[0], WBL[1] and read bit lines RBL[0], RBL[1] arranged in a direction of column.

As a connection relation of the write word line, the read word line, the write bit line, and the read bit line to each memory cell is similar to that in memory cell array 110A in Embodiment 1, description thereof will not be repeated.

Memory cell array 110E in Embodiment 5 is connected to power supply line level control circuit 20A via power supply lines VM[0], VM[1], and connected to a ground line level control circuit 30E via ground lines GM[0], GM[1]. Power supply line VM[0] and ground line GM[0] are connected in common to memory cells 1E-0, 1E-2. Power supply line VM[1] and ground line GM[1] are connected in common to memory cells 1E-1, 1E-3.

As the circuit configuration and operation of power supply line level control circuit 20A has been described in connection with FIG. 2 of Embodiment 1, description thereof will not be repeated. A circuit configuration and operation of ground line level control circuit 30E will be described with reference to FIGS. 16 and 17.

Figure 16:
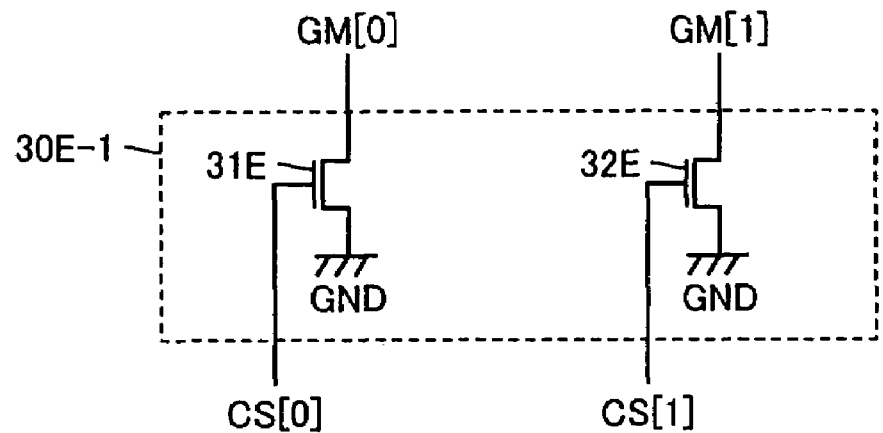
FIG. 16 is a circuit diagram showing a circuit configuration of a ground line level control circuit 30E-1, which is one example of a ground line level control circuit 30E.

FIG. 16 is a circuit diagram showing a circuit configuration of a ground line level control circuit 30E-1, which is one example of ground line level control circuit 30E.

Referring to FIG. 16, ground line level control circuit 30E-1 includes an N-channel MOS transistor 31E connected to ground line GM[0], and an N-channel MOS transistor 32E connected to ground line GM[1].

N-channel MOS transistors 31E, 32E both have the sources provided with ground potential GND. The gates of N-channel MOS transistors 31E, 32E receive level control signals CS[0], CS[1] respectively. Level control signals CS[0], CS[1] link to the column address signal and the read control signal.

Ground line level control circuit 30E-1 sets the potential level of ground line GM[0] to ground potential GND when level control signal CS[0] is at H level, and sets the potential level of ground line GM[0] to floating when level control signal CS[0] is at L level. Similarly, ground line level control circuit 30E-1 sets the potential level of ground line GM[1] to ground potential GND when level control signal CS[1] is at H level, and sets the potential level of ground line GM[1] to floating when level control signal CS[1] is at L level.

Figure 17:
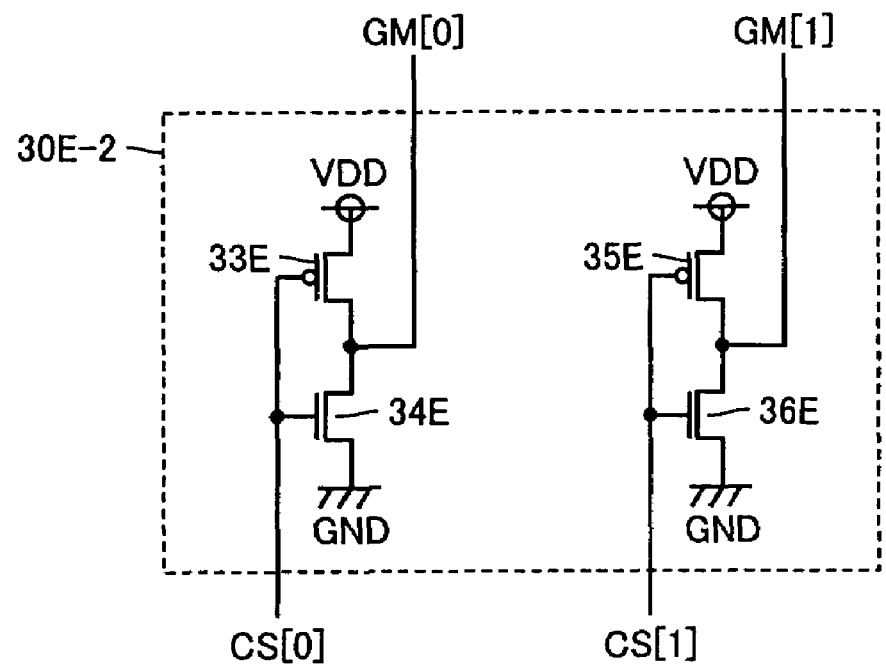
FIG. 17 is a circuit diagram showing a circuit configuration of a ground line level control circuit 30E-2, which is another example of ground line level control circuit 30E.

FIG. 17 is a circuit diagram showing a circuit configuration of a ground line level control circuit 30E-2, which is another example of ground line level control circuit 30E.

Referring to FIG. 17, ground line level control circuit 30E-2 includes a P-channel MOS transistor 33E and an N-channel MOS transistor 34E connected to ground line GM[0], and a P-channel MOS transistor 35E and an N-channel MOS transistor 36E connected to ground line GM[1].

P-channel MOS transistor 33E and N-channel MOS transistor 34E are connected in series between power supply node VDD and ground node GND, and their gates both receive level control signal CS[0]. P-channel MOS transistor 35E and N-channel MOS transistor 36E are connected in series between power supply node VDD and ground node GND, and their gates both receive level control signal CS[1]. Level control signals CS[0], CS[1] link to the column address signal and the read control signal.

Ground line level control circuit 30E-2 sets the potential level of ground line GM[0] to ground potential GND when level control signal CS[0] is at H level, and sets the potential level of ground line GM[0] to power supply potential VDD when level control signal CS[0] is at L level. Similarly, ground line level control circuit 30E-2 sets the potential level of ground line GM[1] to ground potential GND when level control signal CS[1] is at H level, and sets the potential level of ground line GM[1] to power supply potential VDD when level control signal CS[1] is at L level.

In this manner, ground line level control circuit 30E can adopt a circuit configuration of ground line level control circuit 30E-1, or alternatively, adopt a circuit configuration of ground line level control circuit 30E-2.

In other words, ground line level control circuit 30E sets the potential level of ground line GM[0] to ground potential GND when level control signal CS[0] is at H level, and sets the potential level of ground line GM[0] to power supply potential VDD or floating when level control signal CS[0] is at L level. Similarly, ground line level control circuit 30E sets the potential level of ground line GM[1] to ground potential GND when level control signal CS[1] is at H level, and sets the potential level of ground line GM[1] to power supply potential VDD or floating when level control signal CS[1] is at L level.

A specific circuit configuration of a memory cell 1E representing memory cells 1E-0, 1E-1, 1E-2, 1E-3 will now be described. Here, memory cell 1E is assumed to include control lines such as a write word line or a read bit line.

Figure 18:
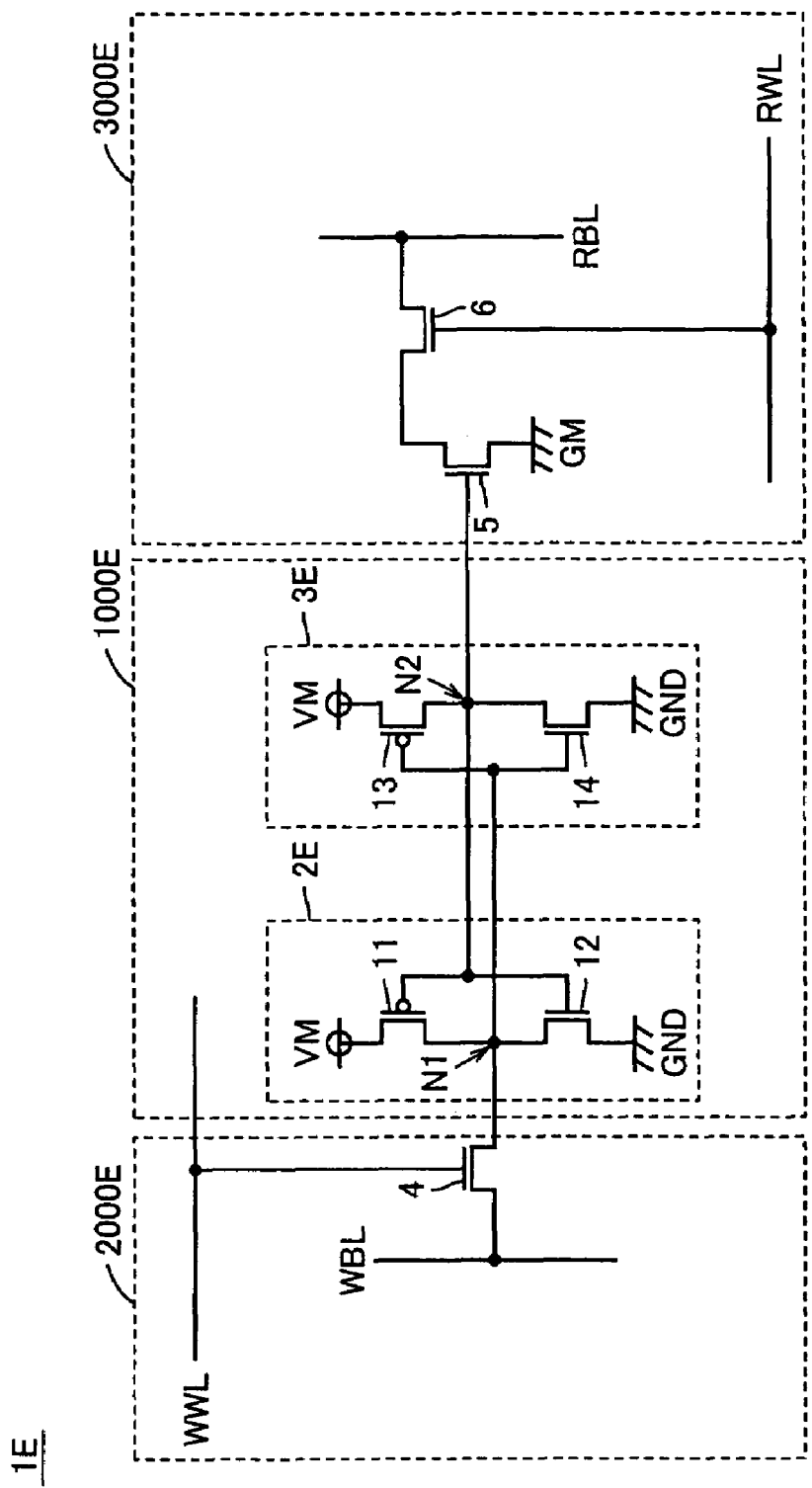
FIG. 18 is a circuit diagram showing a specific circuit configuration of a memory cell 1E in Embodiment 5 of the present invention.

FIG. 18 is a circuit diagram showing a specific circuit configuration of memory cell 1E in Embodiment 5 of the present invention.

Referring to FIG. 18, memory cell 1E in Embodiment 5 includes a data storage portion 1000E, a write port 2000E, and a read port 3000E. Here, as data storage portion 1000E and write port 2000E are identical to data storage portion 1000A and write port 2000A in Embodiment 1 respectively, description thereof will not be repeated.

Read port 3000E in Embodiment 5 is different from read port 3000A in Embodiment 1 only in that ground line GM of which potential level can be controlled is connected to the source of N-channel MOS transistor 5.

An operation of memory cell array 110E including memory cells 1E-0, 1E-1, 1E-2, 1E-3 with the memory cell configuration as above will now be described. Note that description of portions the same as those in Embodiment 1 will not be repeated.

Referring to FIGS. 16 and 17, in memory cell array 110E in Embodiment 5, level control signals CS[0], CS[1] controlling the potential level of ground lines GM[0], GM[1] are bth set to L level during non-reading operation, that is, during waiting or the writing operation.

Accordingly, the potential level of ground lines GM[0], GM[1] are both set to power supply potential VDD or floating. Referring to FIG. 18, the potential level of ground lines GM[0], GM[1] attain the potential level the same as that of read bit lines RBL[0], RBL[1] that are precharged in advance to power supply potential VDD before the reading operation, considering the voltage between the gate and the drain of N-channel MOS transistor 5.

A reading operation of memory cell array 110E will now be described. In the following, an example in which data in memory cell 1E-0 is read will be described with reference to FIGS. 19 and 20.

Figure 19:
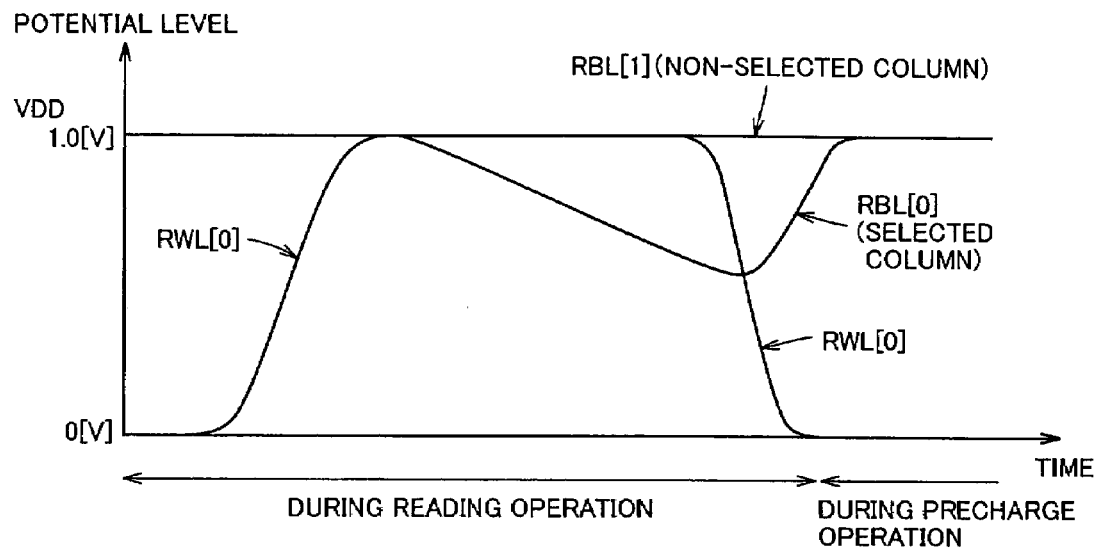
FIG. 19 shows potential change of read word line RWL[0] and read bit lines RBL[0], RBL[1] in memory cell array 10E in Embodiment 5.

FIG. 19 shows potential change of read word line RWL[0] and read bit lines RBL[0], RBL[1] in memory cell array 110E in Embodiment 5.

When the data in memory cell 1E-0 is read, read word line RWL[0] is selected by the row address signal and set to H level (power supply potential VDD) as shown in FIG. 19. Desired data is thus read to read bit line RBL[0]. Power supply potential VDD is set to 1.0V, for example.

In memory cell array 110E in Embodiment 5, during the reading operation, level control signal CS[0] controlling the potential level of ground line GM[0] in the data read column is set to H level, and level control signal CS[1] controlling the potential level of ground line GM[1] in the data non-read column is set to L level. In this manner, the potential level of ground line GM[0] is set to ground potential GND, and the potential level of ground line GM[1] is set to power supply potential VDD or floating.

Figure 20:
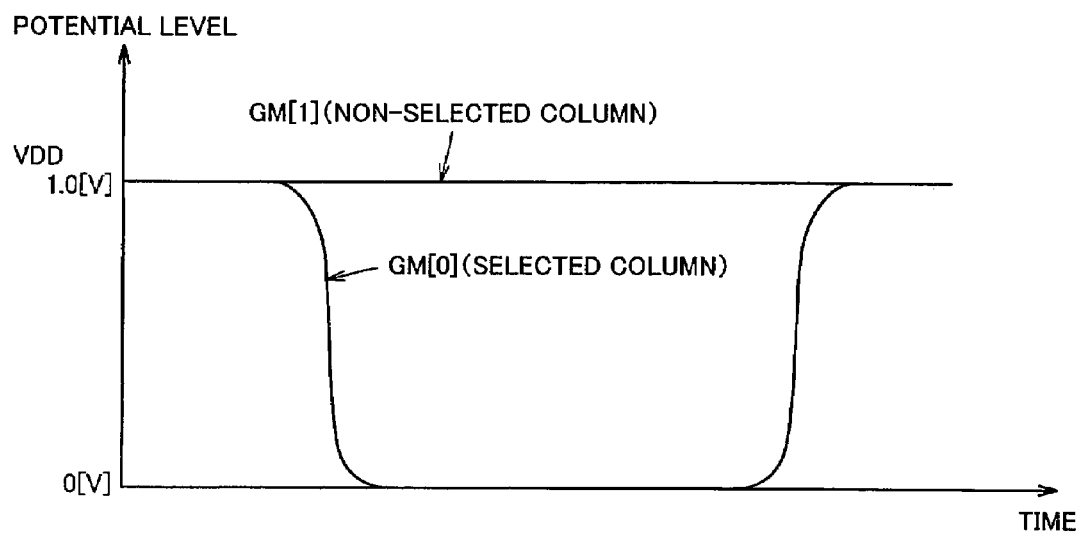
FIG. 20 shows potential change of ground lines GM[0], GM[1] in memory cell array 110E in Embodiment 5.

FIG. 20 shows potential change of ground lines GM[0], GM[1] in memory cell array 110E in Embodiment 5.

During the reading operation, level control signals CS[0], CS[1] are set to H level and L level respectively. Then, as shown in FIG. 20, the potential level of ground line GM[0] in the data read column (selected column) is set to ground potential GND, and the potential level of ground line GM[1] in the data non-read column (non-selected column) is set to power supply potential VDD or floating.

Read bit line RBL[0] of the data read column (selected column) is electrically connected to ground line GM, when the potential level of storage node N2 in FIG. 18 in selected memory cell 1E-0 is at H level. As a result, the potential level of read bit line RBL[0] gradually lowers toward ground potential GND, as shown in FIG. 19. Therefore, data of L level is read to read bit line RBL[0].

On the other hand, read bit line RBL[1] of the data non-read column (non-selected column) maintains the potential level of power supply potential VDD regardless of the potential level of storage node N2 in FIG. 18 in the non-selected memory cell (memory cell 1E-1, for example) as shown in FIG. 19, because read bit line RBL[1] and ground line GM[1] are both at H level.

In this manner, in memory cell array 110E of Embodiment 5, the potential level of read bit line RBL[1] in the data non-read column (non-selected column) does not vary during the reading operation. Therefore, the charging/discharging current in the data non-read column is completely eliminated, and power consumption can be reduced.

As described above, according to Embodiment 5, the potential of the ground line is controlled in response to the level control signal. Thus, power consumption by the charging/discharging current of the bit line or the like as well as by the gate leakage current of the memory cell in the non-selected column can be reduced.

It is to be noted that control of the potential of the ground line in response to the level control signal as in Embodiment 5 can also be adapted to Embodiments 1 to 4.

Embodiment 6

Figure 21:
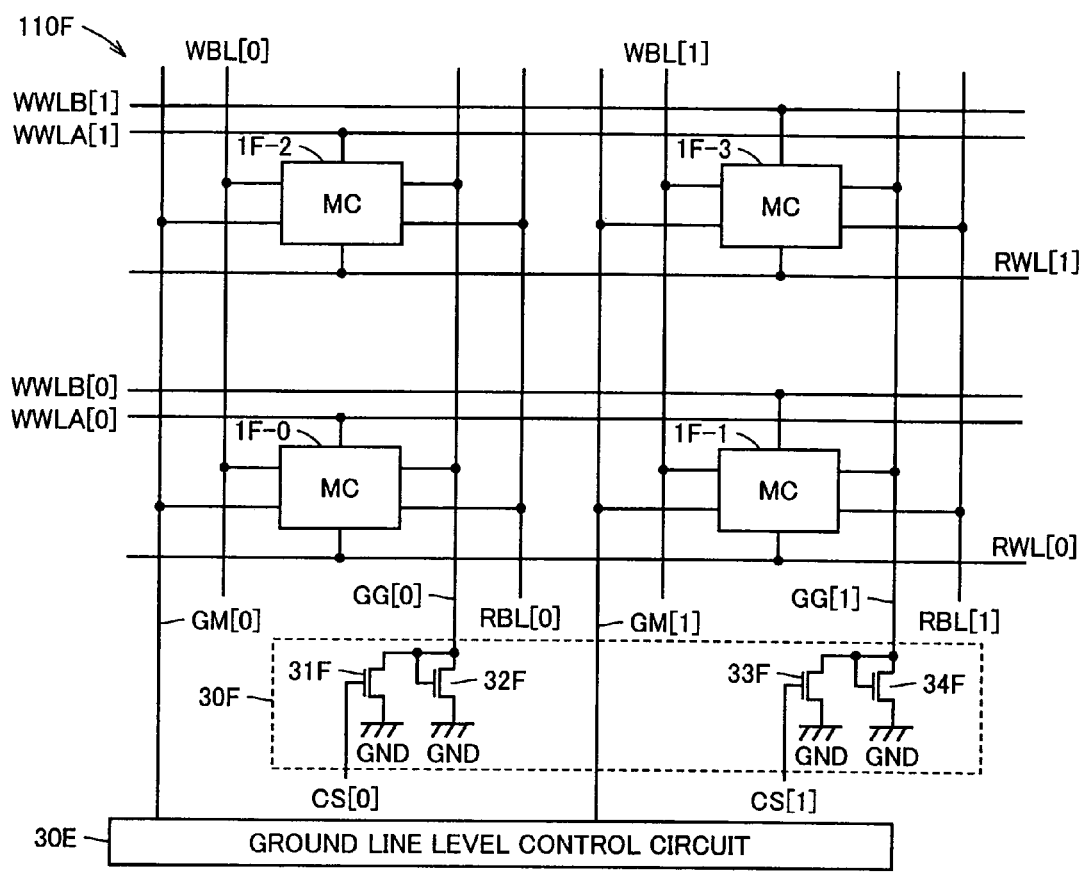
FIG. 21 is a circuit diagram showing a circuit configuration of a memory cell array 110F and its periphery in Embodiment 6 of the present invention.

FIG. 21 is a circuit diagram showing a circuit configuration of a memory cell array 110F and its periphery in Embodiment 6 of the present invention.

Referring to FIG. 21, memory cell array 110F in Embodiment 6 includes memory cells 1F-0, 1F-1, 1F-2, 1F-3 arranged in matrix of rows and columns, write word lines WWLA[0], WWLA[1], WWLB[0], WWLB[1] and read word lines RWL[0], RWL[1] arranged in a direction of row, and write bit lines WBL[0], WBL[1] and read bit lines RBL[0], RBL[1] arranged in a direction of column.

As a connection relation of the write word line, the read word line, the write bit line, and the read bit line to each memory cell is similar to that in memory cell array 110A in Embodiment 1, description thereof will not be repeated.

Memory cell array 110F in Embodiment 6 is connected to ground line level control circuit 30E via ground lines GM[0], GM[1], and connected to a ground line level control circuit 30F via ground lines GG[0], GG[1]. Ground lines GM[0], GG[0] are connected in common to memory cells 1F-0, 1F-2, while ground lines GM[1], GG[1] are connected in common to memory cells 1F-1, 1F-3.

As the circuit configuration and operation of ground line level control circuit 30E has been described in connection with FIGS. 16 and 17 in Embodiment 5, description thereof will not be repeated.

Ground line level control circuit 30F includes N-channel MOS transistors 31F, 32F connected to ground line GG[0], and N-channel MOS transistors 33F, 34F connected to ground line GG[1]. N-channel MOS transistor 32F is diode-connected to ground line GG[0], while N-channel MOS transistor 34F is diode-connected to ground line GG[1].

N-channel MOS transistors 31F to 34F all have the sources provided with ground potential GND. The gates of N-channel MOS transistors 31F, 33F receive level control signals CS[0], CS[1] respectively. Level control signals CS[0], CS[1] link to the column address signal and the read control signal.

Ground line level control circuit 30F sets the potential level of ground line GG[0] to ground potential GND when level control signal CS[0] is at H level, and sets the potential level of ground line GM[0] to Vtn (Vtn is a voltage between the gate and the source of an N-channel MOS transistor) when level control signal CS[0] is at L level. Similarly, ground line level control circuit 30F sets the potential level of ground line GG[1] to ground potential GND when level control signal CS[1] is at H level, and sets the potential level of ground line GM[1] to Vtn when level control signal CS[1] is at L level.

A specific circuit configuration of a memory cell 1F representing memory cells 1F-0, 1F-1, 1F-2, 1F-3 will now be described. Here, memory cell 1F is assumed to include control lines such as a write word line or a read bit line.

Figure 22:
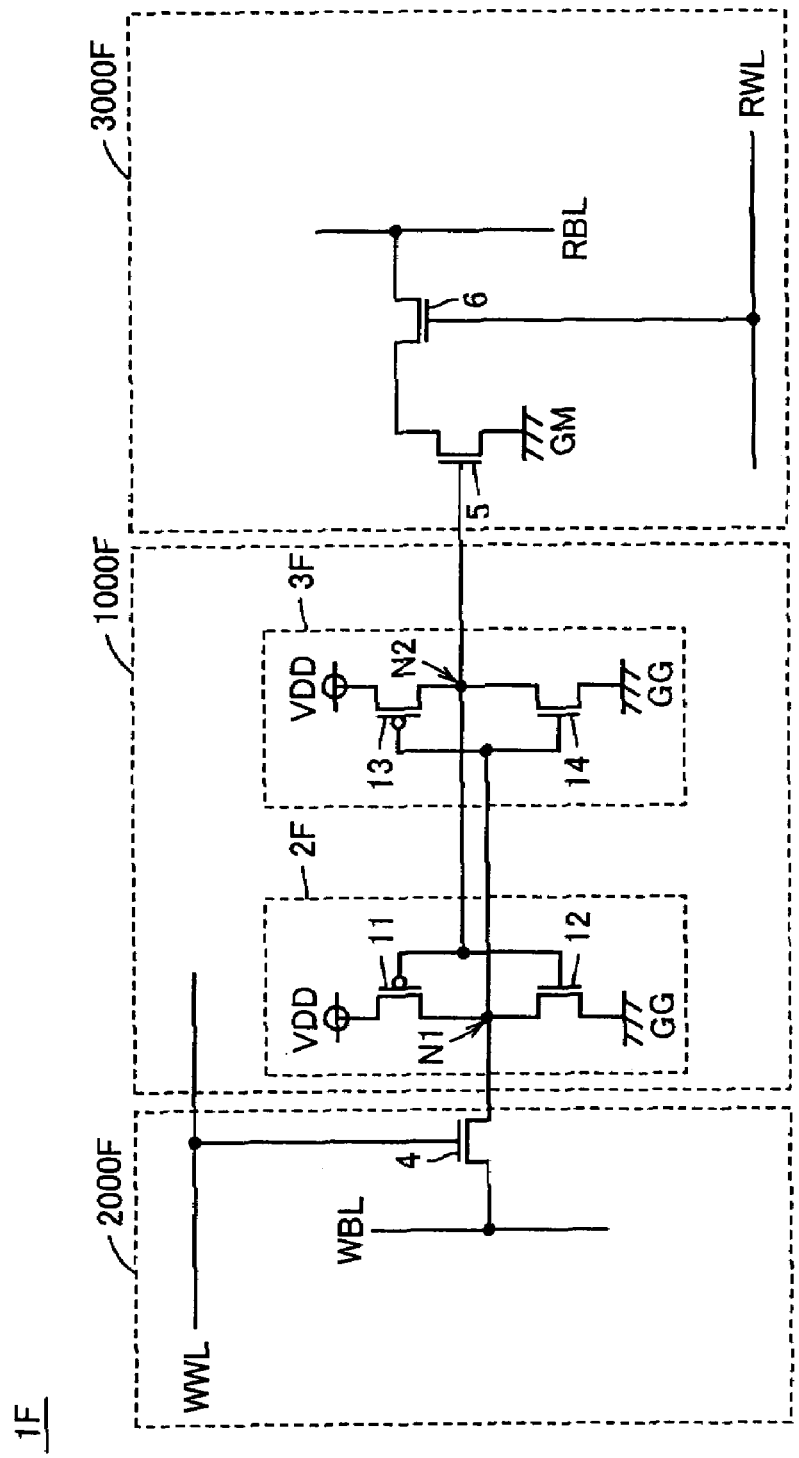
FIG. 22 is a circuit diagram showing a specific circuit configuration of a memory cell 1F in Embodiment 6 of the present invention.

FIG. 22 is a circuit diagram showing a specific circuit configuration of memory cell 1F in Embodiment 6 of the present invention.

Referring to FIG. 22, memory cell 1F in Embodiment 6 includes a data storage portion 1000F, a write port 2000F, and a read port 3000F. Data storage portion 1000F includes inverters 2F, 3F. Here, as write port 2000F is identical to write port 2000A in Embodiment 1, description thereof will not be repeated. As read port 3000F is identical to read port 3000E in Embodiment 5, description thereof will not be repeated.

Data storage portion 1000F in Embodiment 6 is different from data storage portion 1000A in Embodiment 1 only in that the potential level of the power supply line is fixed to power supply potential VDD, and ground line GG of which potential level can be controlled is connected to inverters 2F, 3F.

An operation of memory cell array 110F including memory cells 1F-0, 1F-1, 1F-2, 1F-3 with the memory cell configuration as above will now be described. Note that description of portions the same as those in Embodiment 1 will not be repeated. In addition, as control of the potential level of ground lines GM[0], GM[1] by ground line level control circuit 30E has been described in Embodiment 5, description thereof will not be repeated.

Referring to FIG. 21, in memory cell array 110F in Embodiment 6, level control signal CS[0], CS[1] controlling the potential level of ground lines GG[0], GG[1] are both set to L level during the non-reading operation, that is, during waiting or the writing operation. Currently, as either one of N-channel MOS transistors 12, 14 in FIG. 22 has always turned on, the current steadily flows into ground lines GG[0], GG[1]. Accordingly, the potential level of both ground lines GG[0], GG[1] attains Vtn.

As described in connection with FIG. 5 of Embodiment 1, since the gate leakage current of the MOS transistor varies exponentially with respect to the gate voltage (generic name of the voltage between the gate and the source and the voltage between the gate and the drain), slight lowering of the gate voltage results in significant reduction in the gate leakage current. On the other hand, raise of the potential level of ground lines GG[0], GG[1] from ground potential GND by a certain potential is equivalent to lowering of the potential level of power supply potential VDD by a certain potential, when the raised potential level is considered as the reference.

Therefore, referring to FIG. 21, level control signals CS[0], CS[1] are both set to L level so as to set the potential level of ground lines GG[0], GG[1] to Vtn. In this manner, the gate leakage current during the non-reading operation of memory cell array 110F can significantly be reduced. Thus, power consumption during the non-reading operation of memory cell array 110F can significantly be reduced.

A reading operation of memory cell array 110F will now be described. In the following, an example in which data in memory cell 1F-0 is read will be described with reference to FIG. 23.

Figure 23:
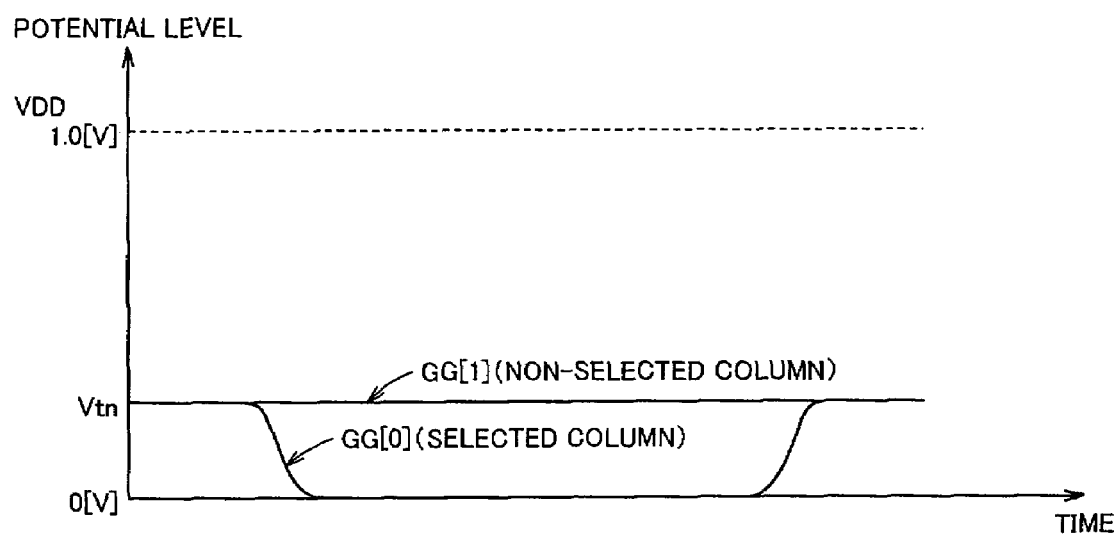
FIG. 23 shows potential change of ground lines GG[0], GG[1] in memory cell array 110F in Embodiment 6.

FIG. 23 shows potential change of ground lines GG[0], GG[1] in memory cell array 110F in Embodiment 6.

When level control signals CS[0], CS[1] are set to H level and L level respectively, the potential level of ground line GG[0] in the data read column (selected column) is set to ground potential GND, and the potential level of ground line GG[1] in the data non-read column (non-selected column) is set to Vtn during the reading operation, as shown in FIG. 23.

As described previously, raise of the potential level of ground lines GG[0], GG[1] from ground potential GND by a certain potential is equivalent to lowering of the potential level of power supply potential VDD by a certain potential, when the raised potential level is considered as the reference.

Therefore, for a reason the same as that described in connection with FIG. 8 of Embodiment 1, the potential level of read bit line RBL[0] of the data read column (selected column) is significantly lowered during the reading operation. On the other hand, the potential level of read bit line RBL[1] of the data non-read column (non-selected column) is not significantly lowered during the reading operation.

Accordingly, read bit line RBL[1] in the data non-read column of which potential level is not lowered significantly during the reading operation can return to H level with a small amount of charging current in a precharge operation.

Thus, by setting level control signals CS[0], CS[1] to H level and L level respectively and by setting the potential of ground lines GG[0], GG[1] to GND and Vtn respectively, power consumption during the reading operation of memory cell array 110F can be reduced.

When the reading operation is completed, level control signal CS[0] is returned to L level in order to reduce power consumption by the gate leakage current, and N-channel MOS transistor 31F in FIG. 21 that has driven the potential level of ground line GG[0] to ground potential GND is turned off. Accordingly, the potential level of ground line GG[0] is gradually raised to the level of Vtn and stabilized thereat as shown in FIG. 23.

As described above, according to Embodiment 6, the potential of the ground line is controlled in response to the level control signal. Thus, power consumption by the charging/discharging current of the bit line or the like as well as by the gate leakage current of the memory cell in the non-selected column can be reduced.

It is to be noted that control of the potential of the ground line in response to the level control signal as in Embodiment 6 can also be adapted to Embodiments 1 to 4.

Embodiment 7

Though Embodiments 1 to 6 described a memory cell array constituted of multi-port memory cells (2-port, for example), Embodiment 7 will describe a memory cell array constituted of single-port memory cells.

Figure 24:
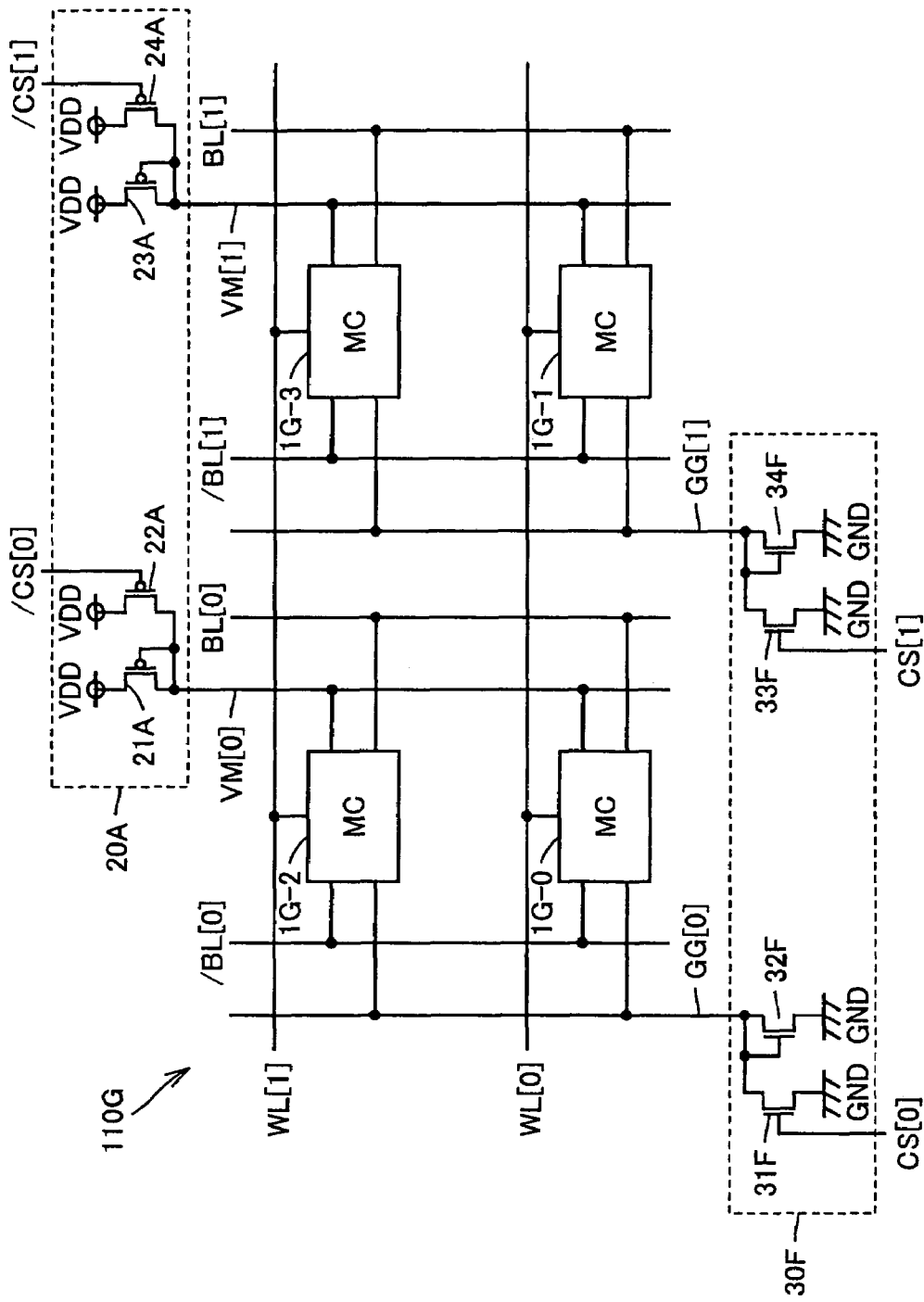
FIG. 24 is a circuit diagram showing a circuit configuration of a memory cell array 110G and its periphery in Embodiment 7 of the present invention.

FIG. 24 is a circuit diagram showing a circuit configuration of a memory cell array 110G and its periphery in Embodiment 7 of the present invention.

Referring to FIG. 24, memory cell array 110G in Embodiment 7 includes memory cells 1G-0, 1G-1, 1G-2, 1G-3 arranged in matrix of rows and columns, word lines WL[0], WL[1] arranged in a direction of row, and bit line pairs BL[0], /BL[0] and BL[1], /BL[1] arranged in a direction of column.

Word line WL[0] is connected in common to memory cells 1G-0, 1G-1, while word line WL[1] is connected in common to memory cells 1G-2, 1G-3. Bit line pair BL[0], /BL[0] is connected in common to memory cells 1G-0, 1G-2, while bit line pair BL[1], /BL[1] is connected in common to memory cells 1G-1, 1G-3.

Memory cell array 110G in Embodiment 7 is connected to power supply line level control circuit 20A via power supply lines VM[0], VM[1], and connected to ground line level control circuit 30F via ground lines GG[0], GG[1]. Power supply line VM[0] and ground line GG[0] are connected in common to memory cells 1G-0, 1G-2. Power supply line VM[1] and ground line GG[1] are connected in common to memory cells 1G-1, 1G-3.

As the circuit configuration and operation of power supply line level control circuit 20A has been described in connection with FIG. 2 of Embodiment 1, description thereof will not be repeated. In addition, as the circuit configuration and operation of ground line level control circuit 30F has been described in connection with FIG. 21 of Embodiment 6, description thereof will not be repeated.

A specific circuit configuration of a memory cell 1G representing memory cells 1G-0, 1G-1, 1G-2, 1G-3 will now be described. Here, memory cell 1G is assumed to include control lines such as a word line or a bit line.

Figure 25:
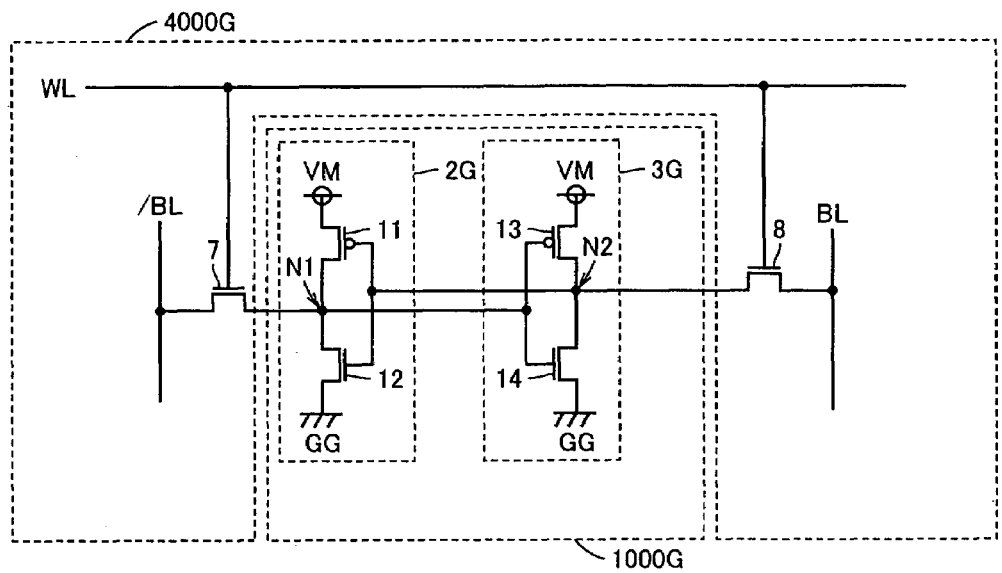
FIG. 25 is a circuit diagram showing a specific circuit configuration of a memory cell 1G in Embodiment 7 of the present invention.

FIG. 25 is a circuit diagram showing a specific circuit configuration of memory cell 1G in Embodiment 7 of the present invention.

Memory cell 1G in Embodiment 7 shown in FIG. 25 has a single-port memory cell configuration. Memory cell 1G includes a data storage portion 1000G and a write/read port 4000G. Data storage portion 1000G includes inverters 2G, 3G.

Data storage portion 1000G in Embodiment 7 is different from data storage portion 1000A in Embodiment 1 only in that ground line GG of which potential level can be controlled is connected to inverters 2G, 3G. In other words, data storage portion 1000G in Embodiment 7 can control the potential level of both power supply line VM and ground line GG.

Write/read port 4000G includes N-channel MOS transistors 7, 8, word line WL, and bit line pair BL, /BL. N-channel MOS transistor 7 has the source connected to storage node N1, has the gate connected to word line WL, and has the drain connected to bit line /BL. N-channel MOS transistor 8 has the source connected to storage node N2, has the gate connected to word line WL, and has the drain connected to bit line BL.

An operation of memory cell array 110G including memory cells 1G-0, 1G-1, 1G-2, 1G-3 with the memory cell configuration as above will now be described. Note that description of portions the same as those in Embodiment 1 will not be repeated.

Referring to FIG. 24, in memory cell array 10G in Embodiment 7, level control signals /CS[0], /CS[1] are both set to H level during the non-reading operation, that is, during waiting or the writing operation (level control signals CS[0], CS[1] are both set to L level). Accordingly, the potential level of power supply lines VM[0], VM[1] is set to VDD-Vtp, and the potential level of ground lines GG[0], GG[1] is set to Vtn.

As a result, the gate leakage current in the non-reading operation of memory cell array 110G can significantly be reduced. Thus, power consumption during the non-reading operation of memory cell array 110G can significantly be reduced.

A reading operation of memory cell array 110G will now be described. In the following, an example in which data in memory cell 1G-0 is read will be described with reference to FIGS. 26 and 27.

Figure 26:
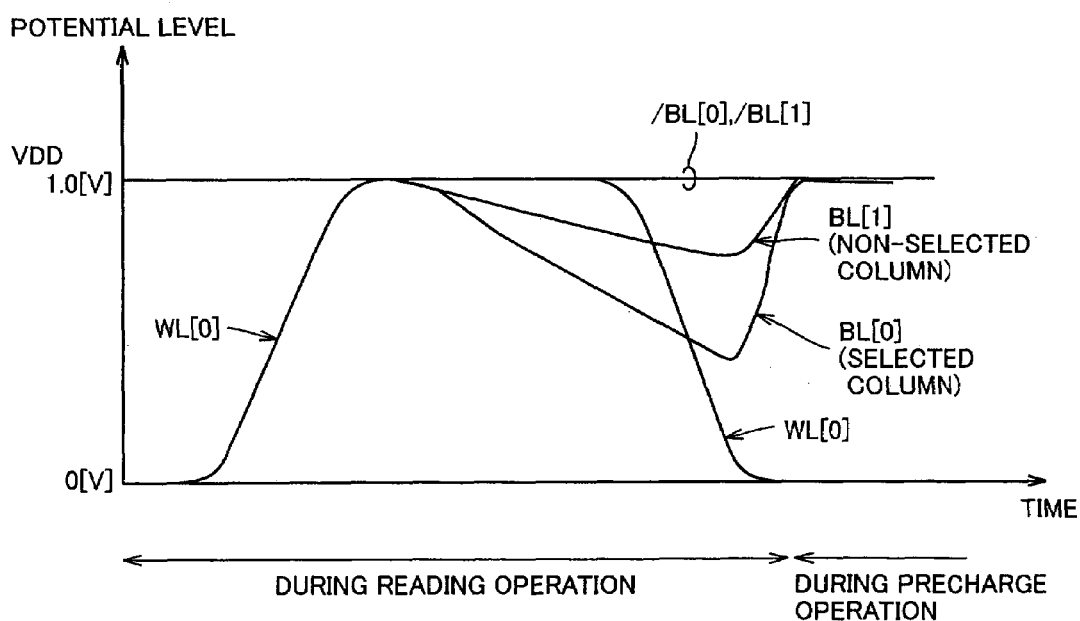
FIG. 26 shows potential change of a word line WL[0], a bit line pair BL[0], /BL[0], and a bit line pair BL[1], /BL[1] in memory cell array 110G in Embodiment 7.

FIG. 26 shows potential change of word line WL[0], bit line pair BL[0], /BL[0], and bit line pair BL[1], /BL[1] in memory cell array 110G in Embodiment 7.

In an example of the memory cell array constituted of single-port memory cells such as memory cell array 110G in Embodiment 7, a differential-type memory cell array operation, in which data of H level or L level is read by detecting lowering of the potential of one of bit line pair BL, /BL arranged for each column, is generally found.

When data in memory cell 1G-0 is read in memory cell array 110G of Embodiment 7, word line WL[0] is selected by the row address signal and set to H level (power supply potential VDD) as shown in FIG. 26. Accordingly, the potential of bit line BL[0] out of bit line pair BL[0], /BL[0] is lowered as shown in FIG. 26, and desired data is read. Power supply potential VDD is set to 1.0V, for example.

As shown in FIG. 24, however, word line WL[0] is also connected to memory cell 1G-1, which is a memory cell in the non-read column and in the same row. As such, when the data in memory cell 1G-0 is read to bit line pair BL[0], /BL[0], the data in memory cell 1G-1 is simultaneously read to bit line pair BL[1], /BL[1].

In memory cell array 110G in Embodiment 7, each data in memory cells 1G-0, 1G-1 that has been read simultaneously is input to a not-shown selector circuit. By selecting the data of one of the bit line pair designated by the column address signal, desired data is read.

Desirably, the potential level of bit line BL[0] in the data read column varies rapidly in order to attain higher speed in the reading operation, as described in Embodiment 1. On the other hand, desirably, the potential level of bit line BL[1] in data non-read column does not vary, in order to suppress the charging/discharging current to reduce power consumption.

In memory cell array 110G in Embodiment 7, during the reading operation, level control signal /CS[0] controlling the potential level of power supply line VM[0] in the data read column is set to L level, and level control signal /CS[1] controlling the potential level of power supply line VM[1] in the data non-read column is set to H level, respectively. In this manner, level control signal CS[0] controlling the potential level of ground line GG[0] in the data read column is set to H level, and level control signal CS[1] controlling the potential level of ground line GG[1] in the data non-read column is set to L level.

Figure 27:
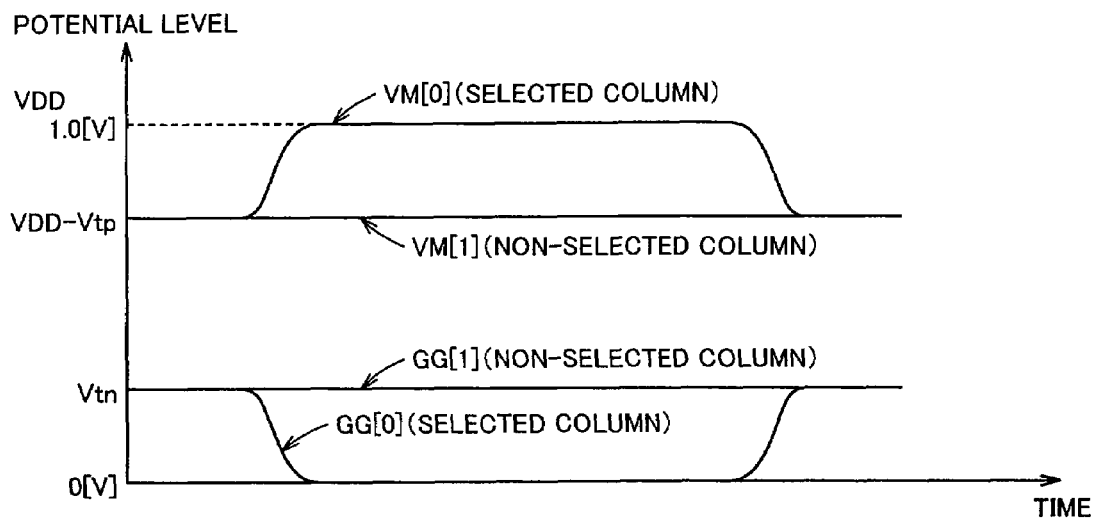
FIG. 27 shows potential change of power supply lines VM[0], VM[1] and ground lines GG[0], GG[1] in memory cell array 110G in Embodiment 7.

FIG. 27 shows potential change of power supply lines VM[0], VM[1] and ground lines GG[0], GG[1] in memory cell array 110G in Embodiment 7.

By setting level control signals /CS[0], /CS[1] to L level and H level respectively, in the reading operation, the potential level at power supply line VM[0] in the data read column (selected column) is set to power supply potential VDD, and the potential level at power supply line VM[1] in the data non-read column (non-selected column) is set to VDD-Vtp (Vtp is the voltage between the gate and the source of a P-channel MOS transistor), as shown in FIG. 27.

Since level control signals CS[0], CS[1] are set to H level and L level respectively, during the reading operation, the potential level at ground line GG[0] in the data read column (selected column) is set to ground potential GND, and the potential level at ground line GG[1] in the data non-read column (non-selected column) is set to Vtn (Vtn is the voltage between the gate and the source of an N-channel MOS transistor), as shown in FIG. 27.

As described previously, raise of the potential level of ground lines GG[0], GG[1] from ground potential GND by a certain potential is equivalent to lowering of the potential level of power supply potential VDD by a certain potential. Here, control of the potential level of ground lines GG[0], GG[1] will particularly be described in detail.

During the reading operation, the potential level of ground line GG in FIG. 25 in selected memory cell 1G-0 is set to GND, and a voltage of power supply potential VDD is applied between the gate and the source of one of N-channel MOS transistors 12, 14 in FIG. 25. Generally, the higher the voltage between the gate and the source is, the higher the drivability of an MOS transistor will be. Therefore, data of bit line BL[0] in the data read column is rapidly pulled.

Consequently, referring to FIG. 26, the potential level of bit line BL[0] in the data read column (selected column) is lowered significantly during the reading operation.

On the other hand, the potential level of ground line GG in FIG. 25 in non-selected memory cell 1G-1 is set to Vtn, and a voltage of power supply potential VDD-Vtn is applied between the gate and the source of one of N-channel MOS transistors 12, 14 in FIG. 25. As non-selected memory cell 1G-1 has the voltage between the gate and the source of one of N-channel MOS transistors 12, 14 lower than that of selected memory cell 1G-0, the data of bit line BL[1] in the data non-read column is pulled slowly.

Consequently, referring to FIG. 26, the potential-level of bit line BL[1] in the data non-read column (non-selected column) is not lowered significantly during the reading operation.

When the potential change of bit line BL[0] is transmitted to data output and the reading operation is completed, the potential level of bit lines BL[0], BL[1] return to H level by precharging, as shown in FIG. 26.

Here, bit line BL[1] in the data non-read column of which potential level is not lowered significantly during the reading operation can return to H level with a small amount of charging current in the precharge operation.

In addition, as the voltage between the gate and the source of the MOS transistor that has turned on in non-selected memory cell 1G-1 is lower than power supply potential VDD, the leakage current in that MOS transistor can be reduced.

Meanwhile, the potential level of ground line GG in FIG. 25 in non-selected memory cell 1G-1 is set to Vtn, that is, floats from ground potential GND. Therefore, when the substrate potential of the N-channel MOS transistor in non-selected memory cell 1G-1 is set to ground potential GND, reverse bias of the Vtn potential is applied between the substrate and the source of the N-channel MOS transistor.

Consequently, the threshold voltage of the N-channel MOS transistor in non-selected memory cell 1G-1 is raised, and the leakage current between the source and the drain of the N-channel MOS transistor can be reduced.

Similarly, as the potential level of power supply line VM in FIG. 25 in non-selected memory cell 1G-1 is set to VDD-Vtp, reverse bias of the Vtp potential is applied between the substrate and the source of the P-channel MOS transistor in non-selected memory cell 1G-1.

Consequently, the threshold voltage of the P-channel MOS transistor in non-selected memory cell 1G-1 is raised, and the leakage current between the source and the drain of the P-channel MOS transistor can be reduced.

As described above, according to Embodiment 7, the potential of the power supply line and the ground line is controlled in response to the level control signal. Thus, power consumption by the charging/discharging current of the bit line or the like as well as by the gate leakage current of the memory cell in the non-selected column can be reduced.

Though Embodiment 7 has described an example in which both power supply line VM and ground line GG are controlled by a unit of columns with respect to the memory cell array having a single-port memory cell configuration, it is possible to control only one of power supply line VM and ground line GG.

Embodiment 8

Though Embodiments 1 to 7 have described a memory cell array and its peripheral circuit, or a memory cell array, Embodiment 8 will describe one example of the power supply line level control circuit in Embodiments 1, 2, 5, and 7.

Figure 28:
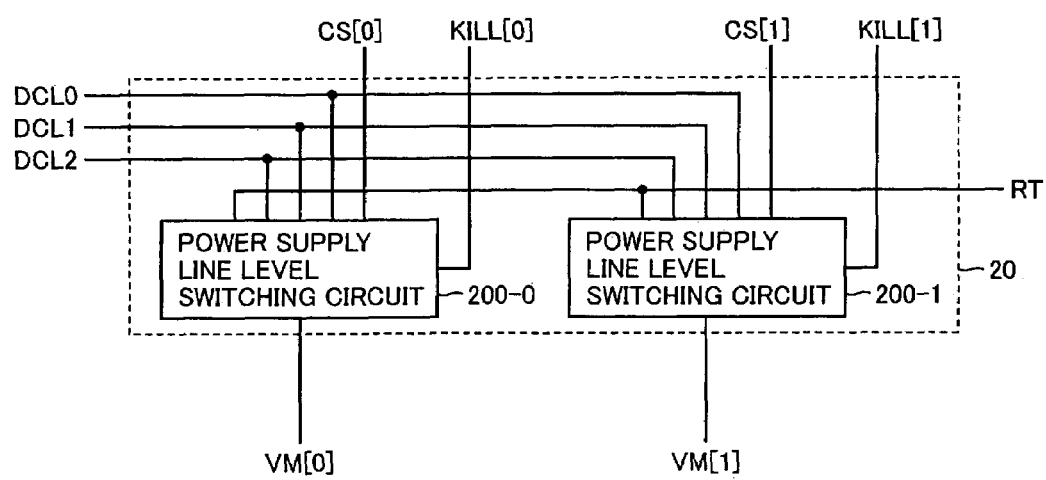
FIG. 28 is a circuit diagram showing a circuit configuration of a power supply line level control circuit 20 in Embodiment 8 of the present invention.

FIG. 28 is a circuit diagram showing a circuit configuration of power supply line level control circuit 20 in Embodiment 8 of the present invention.

Referring to FIG. 28, power supply line level control circuit 20 in Embodiment 8 includes power supply line level switching circuits 200-0, 200-1 provided for each column.

Power supply line level switching circuit 200-0 controls the potential level of power supply line VM[0], in response to a retention test control signal RT, a redundancy replacement control signal KILL[0], retention potential setting signals DCL0, DCL1, DCL2, and level control signal CS[0]. Power supply line level switching circuit 200-1 controls the potential level of power supply line VM[1], in response to retention test control signal RT, a redundancy replacement control signal KILL[1], retention potential setting signals DCL0, DCL1, DCL2, and level control signal CS[1]. A specific circuit configuration of power supply line level switching circuit 200 representing power supply line level switching circuits 200-0, 200-1 will now be described.

Figure 29:
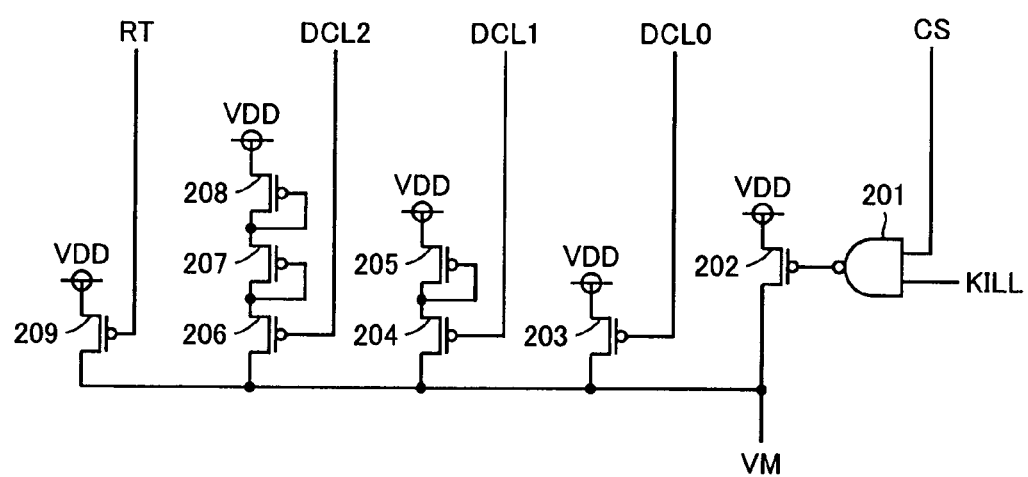
FIG. 29 is a circuit diagram showing a specific circuit configuration of a power supply line level switching circuit 200 in Embodiment 8 of the present invention.

FIG. 29 is a circuit diagram showing a specific circuit configuration of power supply line level switching circuit 200 in Embodiment 8 of the present invention.

Referring to FIG. 29, power supply line level switching circuit 200 of Embodiment 8 includes an NAND circuit 201 receiving level control signal CS and redundancy replacement control signal KILL, P-channel MOS transistors 202 to 204, 206, 209 having the drains connected to power supply line VM, and diode-connected P-channel MOS transistors 205, 207, 208.

P-channel MOS transistors 202, 203, 209 have the sources connected to power supply node VDD. P-channel MOS transistor 202 receives an output of NAND circuit 201 at its gate. P-channel MOS transistor 203 receives retention potential setting signal DCL0 at its gate. P-channel MOS transistor 209 receives retention test control signal RT at its gate.

P-channel MOS transistors 204, 205 are connected in series between power supply node VDD and power supply line VM. P-channel MOS transistor 204 receives retention potential setting signal DCL1 at its gate. P-channel MOS transistors 206, 207, 208 are connected in series between power supply node VDD and power supply line VM. P-channel MOS transistor 206 receives retention potential setting signal DCL2 at its gate.

FIG. 30 illustrates an operation of power supply line level switching circuit 200 in Embodiment 8 of the present invention.

Initially, an example in which level control signal CS also serving as the column select signal is at H level, that is, an example in which a column is selected for access, will be described. Here, redundancy replacement control signal KILL is set to H level. This means that the selected column does not contain a defective cell and a normal operation is attained. Therefore, this column is not replaced with a spare column, and is actually accessed. Here, retention test control signal RT and retention potential setting signals DCL0, DCL1, DCL2 may be at H level or L level during access. FIG. 30 shows with "X" a state where any of H level and L level may be accepted.

Referring to FIG. 29, when level control signal CS and redundancy replacement control signal KILL are both at H level, NAND circuit 201 outputs a signal of L level. In response to this, P-channel MOS transistor 202 turns on, and the potential level of power supply line VM attains power supply potential VDD, as also shown in FIG. 30.

Referring back to FIG. 30, an example in which level control signal CS also serving as the column select signal is at L level, that is, non-access in which a column is neither selected nor accessed, will be described. Here, retention test control signal RT is set to H level. Moreover, one of retention potential setting signals DCL0, DCL1, DCL2 is set to L level, and remaining two signals are set to H level. Here, redundancy replacement control signal KILL may be at H level or L level.

Referring to FIG. 29, when level control signal CS is at L level, NAND circuit 201 outputs a signal of L level regardless of H level/L level of redundancy replacement control signal KILL. In response to this, P-channel MOS transistor 202 turns off. As retention test control signal RT is also at H level, P-channel MOS transistor 209 also turns off.

In non-access, when retention potential setting signal DCL2 is at L level and retention potential setting signals DCL0, DCL1 are at H level, only P-channel MOS transistor 206 out of P-channel MOS transistors 203, 204, 206 turns on, and P-channel MOS transistors 203, 204 turn off. Accordingly, the potential level of power supply line VM is set to VDD-2Vtp (Vtp is the voltage between the gate and the source of a P-channel MOS transistor) as also shown in FIG. 30.

In non-access, when retention potential setting signal DCL1 is at L level and retention potential setting signals DCL0, DCL2 are at H level, only P-channel MOS transistor 204 out of P-channel MOS transistors 203, 204, 206 turns on, and P-channel MOS transistors 203, 206 turn off. Accordingly, the potential level of power supply line VM is set to VDD-Vtp as also shown in FIG. 30.

In non-access, when retention potential setting signal DCL0 is at L level and retention potential setting signals DCL1, DCL2 are at H level, only P-channel MOS transistor 203 out of P-channel MOS transistors 203, 204, 206 turns on, and P-channel MOS transistors 204, 206 turn off. Accordingly, the potential level of power supply line VM is set to power supply potential VDD as also shown in FIG. 30.

In this manner, power supply line level switching circuit 200 can switch the potential level of power supply line VM during non-access by changing a combination of H level/L level of retention potential setting signals DCL0, DCL1, DCL2. By allowing for switch between the potential level of power supply line VM, variation in a value of power supply potential VDD can be addressed in a flexible manner.

For example, when power supply potential VDD is lower than a prescribed value, and if the potential level of power supply line VM is lowered to VDD-2Vtp during non-access, the potential level of power supply line VM becomes too low, and data in the memory cell connected to power supply line VM may not be held correctly. In such a case, by switching the potential level of power supply line VM to VDD-Vtp for example, the data in the memory cell can correctly be held. When the potential level of power supply line VM is too low even after switching the potential level of power supply line VM to VDD-Vtp, the potential level of power supply line VM should only be switched to power supply potential VDD.

Referring back to FIG. 30, an example of redundancy replacement will be described. Here, redundancy replacement control signal KILL is set to L level. This means that the selected column contains a defective cell and the normal operation is not attained. Therefore, this column is replaced with a spare column, and is not actually accessed. Here, retention test control signal RT and retention potential setting signals DCL0, DCL1, DCL2 are all set to H level. Note that level control signal CS may be at H level or L level in redundancy selection.

Referring to FIG. 29, when redundancy replacement control signal KILL is at L level, NAND circuit 201 outputs a signal of L level regardless of H level/L level of level control signal CS. In response to this, P-channel MOS transistor 202 turns off. As retention test control signal RT and retention potential setting signals DCL0, DCL1, DCL2 are all at H level, all of P-channel MOS transistors 203, 204, 206, 209 also turn off. As a result, power supply line VM is set to floating with high impedance (Hi-Z), as also shown in FIG. 30.

Though the selected column is not actually accessed in redundancy selection, the leakage current in that column may abnormally becomes large if the column contains a defect such as short-circuit. By setting power supply line VM to floating in redundancy selection, such an abnormal leakage current can be suppressed.

Referring back to FIG. 30, an example of retention test will be described. Retention test represents a mode to test a data hold property of a memory cell, and is not employed in an ordinary operation state. Here, retention test control signal RT and level control signal CS are both set to L level. Retention potential setting signals DCL0, DCL1, DCL2 are all set to H level. Note that redundancy replacement control signal KILL may be at H level or L level in the retention test.

Referring to FIG. 29, when level control signal CS is at L level, NAND circuit 201 outputs a signal of L level regardless of H level/L level of redundancy replacement control signal KILL. In response to this, P-channel MOS transistor 202 turns off. As retention potential setting signals DCL0, DCL1, DCL2 are all at H level, all of P-channel MOS transistors 203, 204, 206 turn off.

On the other hand, as retention test control signal RT is set to L level, P-channel MOS transistor 209 turns on. Drivability of P-channel MOS transistor 209 is set to be sufficiently small. Meanwhile, drivability required for the memory cell to hold the storage data correctly when the memory cell connected to power supply line VM does not contain a defective memory cell is maintained.

Consider an example in which a memory cell with a large leakage current exists among memory cells connected to power supply line VM. In an ordinary operation test, when a memory cell is accessed, P-channel MOS transistor 202 turns on. Accordingly, even if a memory cell with a large leakage current exists, reading/writing of the memory cell is normally completed due to the drivability of P-channel MOS transistor 202. Therefore, in some cases, the conventional, ordinary operation test could not determine the memory cell with a large leakage current to repair the same by redundancy replacement.

In the retention test of the present invention, P-channel MOS transistor 202 is turned off, and drivability of P-channel MOS transistor 209 that turns on is set to be sufficiently small. Therefore, if a memory cell with a large leakage current exists, the potential level of power supply line VM is lowered by an influence of that memory cell. As such, the memory cell connected to power supply line VM cannot hold the data correctly, and the result of retention test turns out to be defective (fail). By replacing the defective memory cell with a spare column based on this result indicating defect, abnormal leakage current can be eliminated.

As described above, according to Embodiment 8, setting of a variety of control signals input to the power supply line level control circuit is changed in accordance with an operation mode of the memory cell array, whereby optimal setting of the potential level of the power supply line for each operation mode of the memory cell array can be achieved.

Embodiment 9

Embodiment 9 describes one example of the ground line level control circuit in Embodiments 5, 6 and 7.

Figure 31:
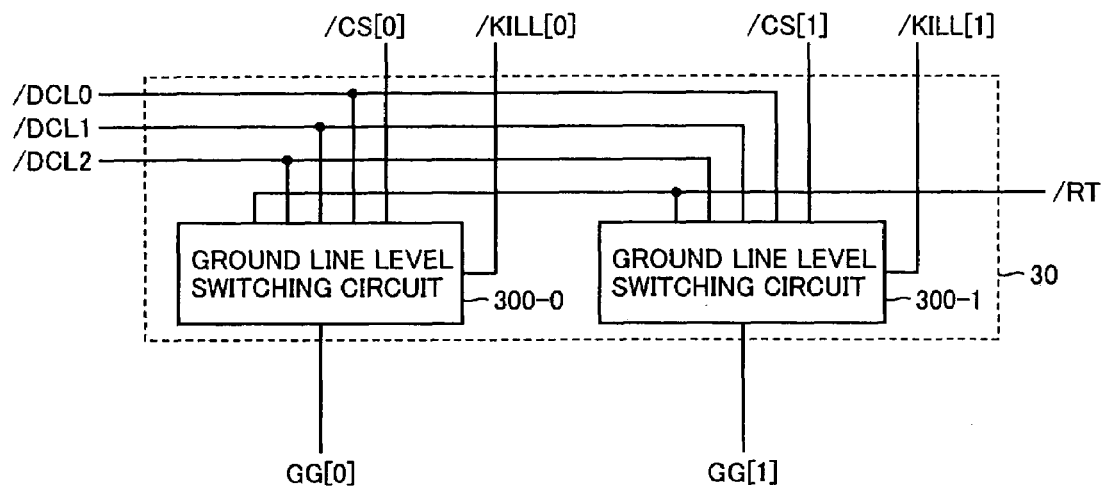
FIG. 31 is a circuit diagram showing a circuit configuration of a ground line level control circuit 30 in Embodiment 9 of the present invention.

FIG. 31 is a circuit diagram showing a circuit configuration of ground line level control circuit 30 in Embodiment 9 of the present invention.

Referring to FIG. 31, ground line level control circuit 30 in Embodiment 9 includes ground line level switching circuits 300-0, 300-1 provided for each column. Ground line level switching circuit 300-0 controls the potential level of ground line GG[0], in response to a retention test control signal /RT, a redundancy replacement control signal /KILL [0], retention potential setting signals /DCL0, /DCL1, /DCL2, and level control signal /CS[0]. Ground line level switching circuit 300-1 controls the potential level of ground line GG[1], in response to retention test control signal /RT, a redundancy replacement control signal /KILL[1], retention potential setting signals /DCL0, /DCL1, /DCL2, and level control signal /CS[1]. A specific circuit configuration of ground line level switching circuit 300 representing ground line level switching circuits 300-0, 300-1 will now be described.

Figure 32:
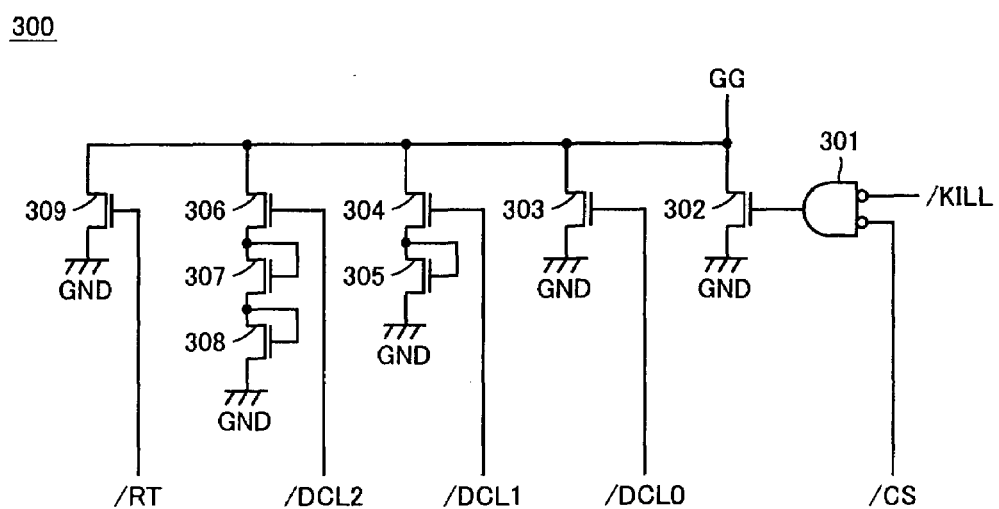
FIG. 32 is a circuit diagram showing a specific circuit configuration of a ground line level switching circuit 300 in Embodiment 9 of the present invention.

FIG. 32 is a circuit diagram showing a specific circuit configuration of ground line level switching circuit 300 in Embodiment 9 of the present invention.

Referring to FIG. 32, ground line level switching circuit 300 of Embodiment 9 includes an NOR circuit 301 receiving level control signal /CS and redundancy replacement control signal /KILL, N-channel MOS transistors 302 to 304, 306, 309 having the drain connected to ground line GG, and diode-connected N-channel MOS transistors 305, 307, 308.

N-channel MOS transistors 302, 303, 309 have the sources connected to ground node GND. N-channel MOS transistor 302 receives an output of NOR circuit 301 at its gate. N-channel MOS transistor 303 receives retention potential setting signal /DCL0 at its gate. N-channel MOS transistor 309 receives retention test control signal /RT at its gate.

N-channel MOS transistors 304, 305 are connected in series between ground node GND and ground line GG. N-channel MOS transistor 304 receives retention potential setting signal /DCL1 at its gate. N-channel MOS transistors 306, 307, 308 are connected in series between ground node GND and ground line GG. N-channel MOS transistor 306 receives retention potential setting signal /DCL2 at its gate.

FIG. 33 illustrates an operation of ground line level switching circuit 300 in Embodiment 9 of the present invention.

Initially, an example in which level control signal /CS also serving as the column select signal is at L level, that is, an example in which a column is selected for access, will be described. Here, redundancy replacement control signal /KILL is set to L level. This means that the selected column does not contain a defective cell and the normal operation is attained. Therefore, this column is not replaced with a spare column, and is actually accessed. Here, retention test control signal /RT and retention potential setting signals /DCL0, /DCL1, /DCL2 may be at H level or L level during access. FIG. 33 shows with "X" a state where any of H level and L level may be accepted.

Referring to FIG. 32, when level control signal /CS and redundancy replacement control signal /KILL are both at H level, NOR circuit 301 outputs a signal of H level. In response to this, N-channel MOS transistor 302 turns on, and the potential level of ground line GG attains ground potential GND, as also shown in FIG. 33.

Referring back to FIG. 33, an example in which level control signal /CS also serving as the column select signal is at L level, that is, non-access in which a column is neither selected nor accessed, will be described. Here, retention test control signal /RT is set to L level. Moreover, one of retention potential setting signals /DCL0, /DCL1, /DCL2 is set to H level, and remaining two signals are set to L level. Here, redundancy replacement control signal /KILL may be at H level or L level.

Referring to FIG. 32, when level control signal /CS is at H level, NOR circuit 301 outputs a signal of L level regardless of H level/L level of redundancy replacement control signal /KILL. In response to this, N-channel MOS transistor 302 turns off. As retention test control signal /RT is also at L level, N-channel MOS transistor 309 also turns off.

In non-access, when retention potential setting signal /DCL2 is at H level and retention potential setting signals /DCL0, /DCL1 are at L level, only N-channel MOS transistor 306 out of N-channel MOS transistors 303, 304, 306 turns on, and N-channel MOS transistors 303, 304 turn off. Accordingly, the potential level of ground line GG is set to GND+2Vtn (Vtn is the voltage between the gate and the source of an N-channel MOS transistor) as also shown in FIG. 33.

In non-access, when retention potential setting signal /DCL1 is at H level and retention potential setting signals /DCL0, /DCL2 are at L level, only N-channel MOS transistor 304 out of N-channel MOS transistors 303, 304, 306 turns on, and N-channel MOS transistors 303, 306 turn off. Accordingly, the potential level of ground line GG is set to GND+Vtn as also shown in FIG. 33.

In non-access, when retention potential setting signal /DCL0 is at H level and retention potential setting signals /DCL1, /DCL2 are at L level, only N-channel MOS transistor 303 out of N-channel MOS transistors 303, 304, 306 turns on, and N-channel MOS transistors 304, 306 turn off. Accordingly, the potential level of ground line GG is set to ground potential GND as also shown in FIG. 33.

In this manner, ground line level switching circuit 300 can switch the potential level of ground line GG during non-access by changing a combination of H level/L level of retention potential setting signals /DCL0, /DCL1, /DCL2. By allowing for switch between the potential level of ground line GG, variation in a value of ground potential GND can be addressed in a flexible manner.

For example, when ground potential GND is higher than a prescribed value, and if the potential level of ground line GG is raised to GND+2Vtn during non-access, the potential level of ground line GG becomes too high, and data in the memory cell connected to ground line GG may not be held correctly. In such a case, by switching the potential level of ground line GG to GND+Vtn for example, the data in the memory cell can correctly be held. When the potential level of ground line GG is too high even after switching the potential level of ground line GG to GND+Vtn, the potential level of ground line GG should only be switched to ground potential GND.

Referring back to FIG. 33, an example of redundancy replacement will be described. Here, redundancy replacement control signal /KILL is set to H level. This means that the selected column contains a defective cell and the normal operation is not attained. Therefore, this column is replaced with a spare column, and is not actually accessed. Retention test control signal /RT and retention potential setting signals /DCL0, /DCL1, /DCL2 are all set to L level. Here, level control signal /CS may be at H level or L level in redundancy selection.

Referring to FIG. 32, when redundancy replacement control signal /KILL is at H level, NOR circuit 301 outputs a signal of L level regardless of H level/L level of level control signal /CS. In response to this, N-channel MOS transistor 302 turns off. As retention test control signal /RT and retention potential setting signals /DCL0, /DCL1, /DCL2 are all at L level, all of N-channel MOS transistors 303, 304, 306, 309 also turn off. As a result, ground line GG is set to floating with high impedance (Hi-Z), as also shown in FIG. 33.

Though the selected column is not actually accessed in redundancy selection, the leakage current in that column may abnormally becomes large if the column contains a defect such as short-circuit. By setting ground line GG to floating in redundancy selection, such an abnormal leakage current can be suppressed.

Referring back to FIG. 33, an example of retention test will be described. Retention test represents a mode to test a data hold property of a memory cell, and is not employed in an ordinary operation state. Here, retention test control signal /RT and level control signal /CS are both set to H level. Retention potential setting signals /DCL0, /DCL1, /DCL2 are all at L level. Redundancy replacement control signal /KILL may be at H level or L level in the retention test.

Referring to FIG. 32, when level control signal /CS is at H level, NOR circuit 301 outputs a signal of L level regardless of H level/L level of redundancy replacement control signal /KILL. In response to this, N-channel MOS transistor 302 turns off. As retention potential setting signals /DCL0, /DCL1, /DCL2 are all at L level, all of N-channel MOS transistors 303, 304, 306 turn off.

On the other hand, as retention test control signal /RT is at H level, N-channel MOS transistor 309 turns on. Drivability of N-channel MOS transistor 309 is set to be sufficiently small. Meanwhile, drivability required for the memory cell to hold the storage data correctly when the memory cell connected to ground line GG does not contain a defective memory cell is maintained.

Consider an example in which a memory cell with a large leakage current exists among memory cells connected to ground line GG. In an ordinary operation test, when a memory cell is accessed, N-channel MOS transistor 302 turns on. Accordingly, even if a memory cell with a large leakage current exists, reading/writing of the memory cell is normally completed due to drivability of N-channel MOS transistor 302. Therefore, the conventional, ordinary operation test could not determine the memory cell with a large leakage current to repair the same by redundancy replacement.

In the retention test of the present invention, N-channel MOS transistor 302 is turned off, and drivability of N-channel MOS transistor 309 which turns on is set to be sufficiently small. Therefore, if a memory cell with a large leakage current exists, the potential level of ground line GG is lowered by an influence of that memory cell. As such, the memory cell connected to ground line GG cannot hold the data correctly, and the result of retention test turns out to be defective (fail). By replacing the defective memory cell with a spare column based on this result indicating defect, abnormal leakage current can be eliminated.

As described above, according to Embodiment 9, setting of a variety of control signals input to the ground line level control circuit is changed in accordance with an operation mode of the memory cell array, whereby optimal setting of the potential level of the ground line for each operation mode of the memory cell array can be achieved.

Embodiment 10

Embodiment 10 describes a setting signal control circuit controlling the logic level of retention potential setting signals DCL0, DCL1, DCL2 described in Embodiments 8 and 9 in accordance with magnitude of power supply potential VCC.

Figure 34:
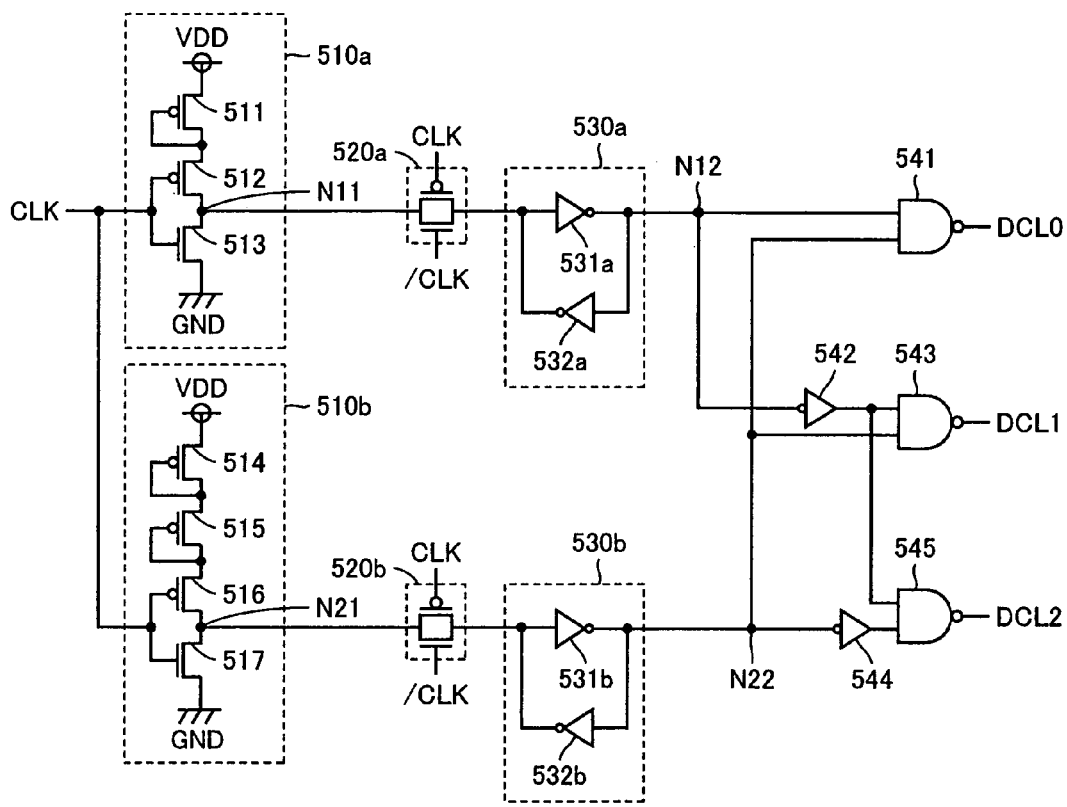
FIG. 34 is a circuit diagram showing a circuit configuration of a setting signal control circuit 500 in Embodiment 10 of the present invention.

FIG. 34 is a circuit diagram showing a circuit configuration of a setting signal control circuit 500 in Embodiment 10 of the present invention.

Referring to FIG. 34, setting signal control circuit 500 in Embodiment 10 includes potential level adjustment circuits 510a, 510b, transfer gates 520a, 520b, latch circuits 530a, 530b, NAND circuits 541, 543, 545, and inverters 542, 544.

Potential level adjustment circuit 510a includes a diode-connected P-channel MOS transistor 511, and a P-channel MOS transistor 512 and an N-channel MOS transistor 513 connected to a node N11. P-channel MOS transistors 511, 512 and N-channel MOS transistor 513 are connected in series between power supply node VDD and ground node GND. P-channel MOS transistor 512 and N-channel MOS transistor 513 receive a clock signal CLK at their gates.

In potential level adjustment circuit 510a, when clock signal CLK is at L level, P-channel MOS transistor 512 turns on, and N-channel MOS transistor 513 turns off. As a result, the potential level of node N11 is set to VDD-Vtp (Vtp is the voltage between the gate and the source of a P-channel MOS transistor). On the other hand, when clock signal CLK is at H level, P-channel MOS transistor 512 turns off, and N-channel MOS transistor 513 turns on. As a result, potential level of node N11 is set to ground potential GND.

Potential level adjustment circuit 510b includes diode-connected P-channel MOS transistors 514, 515, and a P-channel MOS transistor 516 and an N-channel MOS transistor 517 connected to node N11. P-channel MOS transistors 514, 515, 516 and N-channel MOS transistor 517 are connected in series between power supply node VDD and ground node GND. P-channel MOS transistor 516 and N-channel MOS transistor 517 receive clock signal CLK at their gates.

In potential level adjustment circuit 510b, when clock signal CLK is at L level, P-channel MOS transistor 516 turns on, and N-channel MOS transistor 517 turns off. As a result, the potential level of a node N21 is set to VDD-2Vtp. On the other hand, when clock signal CLK is at H level, P-channel MOS transistor 516 turns off, and N-channel MOS transistor 517 turns on. As a result, the potential level of node N21 is set to ground potential GND.

Transfer gate 520a is connected to node N11. Transfer gate 520a passes an input signal at potential level VDD-Vtp input from potential level adjustment circuit 510a when clock signal CLK is at L level. On the other hand, transfer gate 520a isolates an input signal at ground potential GND input from potential level adjustment circuit 510a when clock signal CLK is at H level.

Transfer gate 520b is connected to node N21. Transfer gate 520b passes an input signal at potential level VDD-2Vtp input from potential level adjustment circuit 510b when clock signal CLKis at L level. On the other hand, transfer gate 520b isolates an input signal at ground potential GND input from potential level adjustment circuit 510b when clock signal CLK is at H level.

Latch circuit 530a includes inverters 531a, 532a connected so as to form a ring. Latch circuit 530a provides an output signal to a node N12 in response to an input signal at potential level VDD-Vtp input from potential level adjustment circuit 510a via transfer gate 520a when clock signal CLK is at L level. Latch circuit 530a inverts the input signal when potential level VDD-Vtp thereof is higher than an input threshold voltage Vth. On the other hand, latch circuit 530a enters a data hold state because transfer gate 520a is isolated when clock signal CLK is at L level.

Latch circuit 530b includes inverters 531b, 532b connected so as to form a ring. Latch circuit 530b provides an output signal to a node N22 in response to an input signal at potential level VDD-2Vtp input from potential level adjustment circuit 510b via transfer gate 520b when clock signal CLK is at L level. Latch circuit 530b inverts the input signal when potential level VDD-2Vtp thereof is higher than input threshold voltage Vth. On the other hand, latch circuit 530b enters a data hold state because transfer gate 520b is isolated when dock signal CLK is at L level.

NAND circuit 541 outputs retention potential setting signal DCL0 in response to signals from nodes N12, N22. Inverter 542 inverts a signal from node N12. NAND circuit 543 outputs retention potential setting signal DCL1 in response to signals from inverter 542 and node N22. Inverter 544 inverts a signal from node N22. NAND circuit 545 outputs retention potential setting signal DCL2 in response to signals from inverters 542, 544.

FIGS. 35A to 35D are operational waveform diagrams illustrating an operation of setting signal control circuit 500 respectively in Embodiment 10 of the present invention.

Figure 35A:
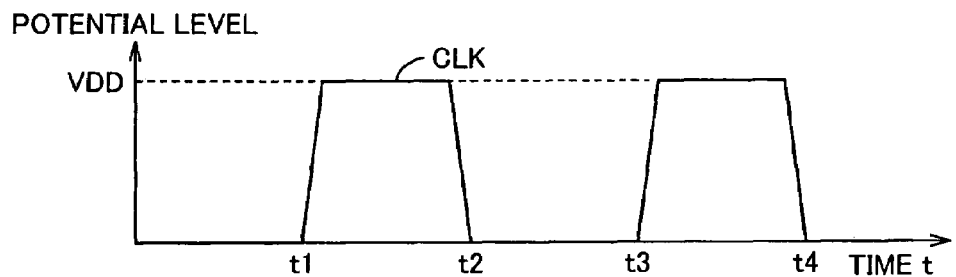
FIGS. 35A to 35D are operational waveform diagrams for illustrating an operation of setting signal control circuit 500 respectively in Embodiment 10 of the present invention.

FIG. 35A shows change in the potential level of clock signal CLK. As shown in FIG. 35A, clock signal CLK rises to H level (power supply potential VDD) at time t1 and t3, and falls to L level at time t2 and t4.

Figure 35B:
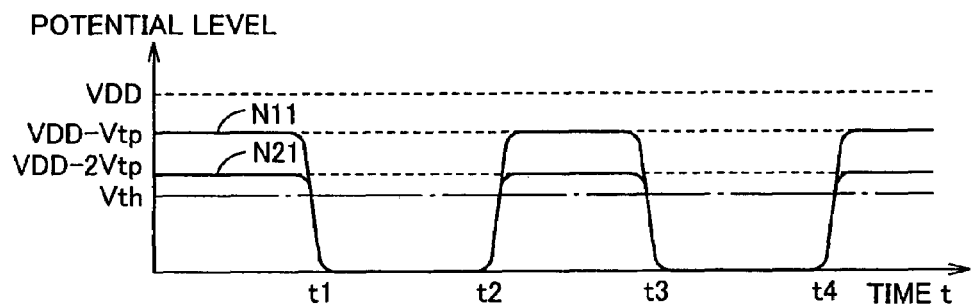
Figure 35C:
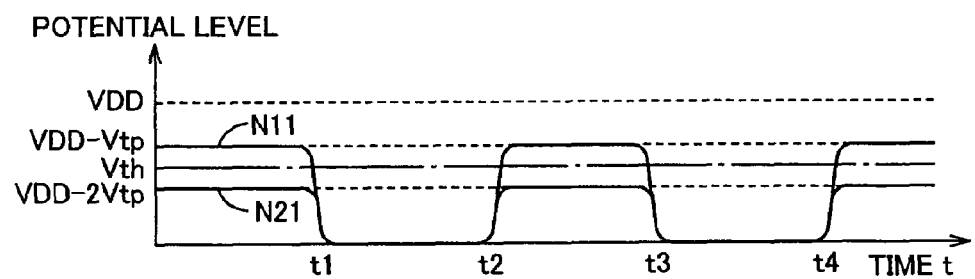
Figure 35D:
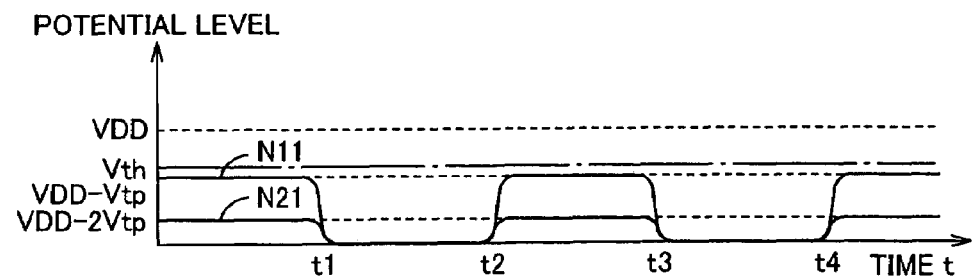

FIGS. 35B, 35C and 35D all show change in the potential level at nodes N11 and N21. As described in connection with FIG. 34, time t1 to t4 at which the potential level of nodes N11, N21 changes in FIGS. 35B, 35C, 35D is in synchronization with time t1 to t4 at which the potential level of clock signal CLK changes in FIG. 35A.

As shown in FIGS. 35B, 35C and 35D, the potential level at node N11 falls at time t1 and t3, and rises to VDD-Vtp at time t2, t4. In addition, the potential level at node N21 falls at time t1 and t3, and rises to VDD-2Vtp at time t2, t4.

In this manner, the potential level of nodes N11, N21 are set to VDD-Vtp and VDD-2Vtp respectively when clock signal CLK is at L level. On the other hand, these potential levels VDD-Vtp and VDD-2Vtp vary in accordance with variation in the value of power supply potential VDD. FIGS. 35B, 35C and 35D illustrate the potential level of nodes N11, N21 when power supply potential VDD is varied in three examples in the following, based on a relation with input threshold voltage Vth in latch circuits 530a, 530b in FIG. 34.

FIG. 35B shows change in the potential level of nodes N11, N21 when potential levels VDD-Vtp and VDD-2Vtp are both higher than input threshold voltage Vth.

As shown in FIG. 35B, when power supply potential VDD is sufficiently high, potential levels VDD-Vtp and VDD-2Vtp of the input signals provided to latch circuits 530a, 530b in FIG. 34 are both higher than input threshold voltage Vth. Here, as described in connection with FIG. 34, latch circuits 530a, 530b in FIG. 34 both invert the input signal when clock signal CLK is at L level. As a result, the potential level of nodes N12, N22 are both set to L level.

In response to this, retention potential setting signals DCL0, DCL1, DCL2 are set to H level, H level and L level respectively, referring to FIG. 34. These retention potential setting signals DCL0, DCL1, DCL2 are input to power supply line level switching circuit 200 in FIG. 29, and retention test control signal RT and level control signal CS are set to H level and L level respectively, whereby the potential level of power supply line VM is set to VDD-2Vtp, as shown in FIG. 30.

As described above, when power supply potential VDD is sufficiently high, retention potential setting signals DCL0, DCL1, DCL2 are set to H level, H level and L level respectively. Consequently, the potential level of power supply line VM is set to as low as VDD-2Vtp.

FIG. 35C shows change in the potential level of nodes N11, N21 when potential level VDD-Vtp is higher than input threshold voltage Vth and potential level VDD-2Vtp is lower than input threshold voltage Vth.

As shown in FIG. 35C, when power supply potential VDD is lower than in the example of FIG. 35B, potential level VDD-Vtp of the input signal provided to latch circuit 530a in FIG. 34 is higher than input threshold voltage Vth, and potential level VDD-2Vtp of the input signal provided to -latch circuit 530b in FIG. 34 is lower than input threshold voltage Vth.

Here, as described in connection with FIG. 34, when clock signal CLK is at L level, latch circuit 530a in FIG. 34 inverts the input signal, whereas latch circuit 530b in FIG. 34 does not invert the same. As a result, the potential level of nodes N12, N22 are set to L level and H level respectively.

In response to this, retention potential setting signals DCL0, DCL1, DCL2 are set to H level, L level and H level respectively, referring to FIG. 34. These retention potential setting signals DCL0, DCL1, DCL2 are input to power supply line level switching circuit 200 in FIG. 29, and retention test control signal RT and level control signal CS are set to H level and L level respectively, whereby the potential level of power supply line VM is set to VDD-Vtp, as shown in FIG. 30.

As described above, when power supply potential VDD is lower than in the example of FIG. 35B, retention potential setting signals DCL0, DCL1, DCL2 are set to H level, L level and H level respectively. As a result, the potential level of power supply line VM is set to VDD-Vtp, and lowering of the potential level can be suppressed.

FIG. 35D shows change in the potential level of nodes N11, N21 when the potential levels VDD-Vtp and VDD-2Vtp are both lower than input threshold voltage Vth.

As shown in FIG. 35D, when power supply potential VDD is further lower than in the example of FIG. 35C, potential levels VDD-Vtp and VDD-2Vtp of the input signal provided to latch circuits 530a, 530b in FIG. 34 are both lower than input threshold voltage Vth. Here, as described in connection with FIG. 34, neither of latch circuits 530a, 530b in FIG. 34 inverts the input signal when clock signal CLK is at L level. As a result, the potential level of nodes N12, N22 are both set to H level.

In response to this, retention potential setting signals DCL0, DCL1, DCL2 are set to L level, H level and H level respectively, referring to FIG. 34. These retention potential setting signals DCL0, DCL1, DCL2 are input to power supply line level switching circuit 200 in FIG. 29, and retention test control signal RT and level control signal CS are set to H level and L level respectively, whereby the potential level of power supply line VM is set to power supply potential VDD, as shown in FIG. 30.

As described above, when power supply potential VDD is further lower than in the example of FIG. 35C, retention potential setting signals DCL0, DCL1, DCL2 are set to L level, H level and H level respectively. Consequently, the potential level of power supply line VM can be returned to power supply potential VDD.

Therefore, setting signal control circuit 500 in Embodiment 10 can control each logic level of retention potential setting signals DCL0, DCL1, DCL2 in accordance with variation in power supply potential VDD, if it happens. As such, even if power supply potential VDD varies, the potential level of power supply line VM can automatically be adjusted to an optimal value, so as not to deteriorate the data hold property of the memory cell during non-access due to variation in power supply potential VDD.

In chip designing in a semiconductor memory device of recent days, in order to achieve lower power consumption, the power supply voltage is dynamically fluctuated in accordance with an operation status. Setting signal control circuit 500 in Embodiment 10 can adapt to such fluctuation of the power supply voltage.

Note that lowering of the potential level of power supply potential VDD by a certain value is equivalent to raise of ground potential GND by that value, when the lowered potential level is considered as reference. Therefore, setting signal control circuit 500 can supply retention potential setting signals /DCL0, /DCL1, /DCL2 to ground line level control circuit 30 in Embodiment 9.

As described above, according to Embodiment 10, the logic level of retention potential setting signals DCL0, DCL1, DCL2 is controlled in accordance with variation in power supply potential VDD. Therefore, even if power supply potential VDD varies, the potential level of power supply line VM can automatically be adjusted to an optimal value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of memory cells arranged in matrix of rows and columns;
a plurality of word lines arranged for each row of said plurality of memory cells;
a plurality of bit line pairs arranged for each column of said plurality of memory cells, each of said plurality of memory cells including a data storage portion holding data, and a data write/read portion performing write/read of data to/from said data storage portion, and said data storage portion having first and second inverter circuits connected in common to each of a power supply line and a ground line arranged corresponding to respective columns of said plurality of memory cells; and
a potential line level control circuit controlling a potential level of said power supply line to a power supply potential or to a first potential level lower than the power supply potential for each column in response to a level control signal set for each column, and controlling a potential level of said ground line to a ground potential or to a second potential level higher than the ground potential for each column in response to a level control signal set for each column.

2. The semiconductor memory device according to claim 1, wherein
said potential line level control circuit controls the potential level of said power supply line to said first potential level and controls the potential level of said ground line to said second potential level for each column during a non-reading operation, and controls the potential level of said power supply line to the power supply potential with respect to a selected column and to said first potential level with respect to a non-selected column respectively and controls the potential level of said ground line to the ground potential with respect to a selected column and to said pfeselibed second potential level with respect to a non-selected column respectively, during a reading operation.

3. The semiconductor memory device according to claim 1, wherein
said potential line level control circuit includes a plurality of power supply line level switching circuits provided for each column and switching the potential level of said power supply line to the power supply potential, a plurality of first potential levels lower than the power supply potential, or floating for each column, in response to at least one of a retention test control signal, a redundancy replacement control signal, a plurality of retention potential setting signals, and said level control signal, and
a plurality of ground line level switching circuits provided for each column and switching the potential level of said ground line to the ground potential, a plurality of second potential levels higher than the ground potential, or floating for each column, in response to at least one of said retention test control signal, said redundancy replacement control signal, said plurality of retention potential setting signals, and said level control signal.

4. The semiconductor memory device according to claim 3, wherein
said power supply line level switching circuit switches the potential level of said power supply line to the power supply potential during access and retention test, switches the potential level of said power supply line to the power supply potential or said plurality of first potential levels during non-access, and switches the potential level of said power supply line to floating during redundancy replacement, and
said ground line level switching circuit switches the potential level of said ground line to the ground potential during access and retention test, switches the potential level of said ground line to the ground potential or said plurality of second potential levels during non-access, and switches the potential level of said ground line to floating during redundancy replacement.

5. The semiconductor memory device according to claim 3, further comprising a setting signal control circuit controlling a logic level of said plurality of retention potential setting signals in synchronization with a clock signal in accordance with magnitude of the power supply potential.

6. The semiconductor memory device according to claim 5, wherein said setting signal control circuit includes
a first potential level adjustment circuit outputting a first power supply potential shift signal having the potential level lower than the power supply potential by a prescribed value, in synchronization with said clock signal,
a second potential level adjustment circuit outputting a second power supply potential shift signal having the potential level lower than said first potential level by a prescribed value, in synchronization with said clock signal, a first latch circuit outputting a first select control signal in accordance with a result obtained by comparison with an input threshold voltage, upon receiving said first power supply potential shift signal, and a second latch circuit outputting a second select control signal in accordance with a result obtained by comparison with said input threshold voltage, upon receiving said second power supply potential shift signal, and said setting signal control circuit controls the logic level of said plurality of retention potential setting signals in accordance with a combination of said first and second select control signals.

* * * * *